(12) United States Patent
Yasuda et al.

(10) Patent No.: US 9,063,438 B2
(45) Date of Patent: *Jun. 23, 2015

(54) EXPOSURE APPARATUS, EXPOSURE METHOD, AND METHOD FOR PRODUCING DEVICE

(75) Inventors: Masahiko Yasuda, Itabashi-ku (JP); Takahiro Masada, Fukaya (JP); Yuho Kanaya, Kumagaya (JP); Tadashi Nagayama, Toshima-ku (JP)

(73) Assignee: NIKON CORPORATION, Tokyo (JP)

( * ) Notice: Subject to any disclaimer, the term of this patent is extended or adjusted under 35 U.S.C. 154(b) by 265 days.

This patent is subject to a terminal disclaimer.

(21) Appl. No.: 13/354,899

(22) Filed: Jan. 20, 2012

(65) Prior Publication Data

US 2012/0120381 A1  May 17, 2012

Related U.S. Application Data

(60) Division of application No. 11/399,537, filed on Apr. 7, 2006, now Pat. No. 8,130,361, and a continuation of application No. PCT/JP2004/015332, filed on Oct. 12, 2004.

(30) Foreign Application Priority Data

Oct. 9, 2003 (JP) ................................. 2003-350628
Feb. 20, 2004 (JP) ................................. 2004-045103

(51) Int. Cl.
  *G03F 9/00* (2006.01)
  *G03F 7/20* (2006.01)

(52) U.S. Cl.
  CPC .......... *G03F 9/7088* (2013.01); *G03F 7/70341* (2013.01)

(58) Field of Classification Search
  CPC .. G03F 7/70341; G03F 9/7088; G03F 9/7042
  USPC ............. 355/30, 53, 67; 378/34, 35; 430/322; 250/492.2
  See application file for complete search history.

(56) References Cited

U.S. PATENT DOCUMENTS 4,346,164 A  8/1982  Tabarelli et al.
4,465,368 A  8/1984  Matsuura et al.
(Continued)

FOREIGN PATENT DOCUMENTS

DE  221 563 A1  4/1985
DE  224 448 A1  7/1985
(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.
(Continued)

*Primary Examiner* — Peter B Kim
(74) *Attorney, Agent, or Firm* — Oliff PLC

(57) ABSTRACT

A liquid immersion exposure apparatus includes a projection system having a last optical element, the projection system projecting a beam onto a substrate through an immersion liquid; a movable stage having a holder by which the substrate is held; a measurement member provided on the movable stage, the measurement member having a measurement portion covered with a light-transmissive material; a first alignment system by which an alignment mark is detected not through the immersion liquid; and a second alignment system which optically obtains, using the measurement member, first positional information of the beam projected by the projection system through the immersion liquid. In order to obtain the first positional information, the movable stage is moved so that the measurement member is under the projection system and a gap between the projection system and the measurement member is filled with the immersion liquid.

41 Claims, 15 Drawing Sheets

(56) References Cited

U.S. PATENT DOCUMENTS

| | | | |
|---|---|---|---|
| 4,480,910 A | 11/1984 | Takanashi et al. |
| 4,650,983 A | 3/1987 | Suwa |
| 4,780,617 A | 10/1988 | Umatate et al. |
| 5,117,254 A | 5/1992 | Kawashima et al. |
| 5,138,176 A | 8/1992 | Nishi |
| 5,243,195 A | 9/1993 | Nishi |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,715,039 A | 2/1998 | Fukuda et al. |
| 5,825,043 A | 10/1998 | Suwa |
| 5,844,247 A | 12/1998 | Nishi |
| 5,874,820 A | 2/1999 | Lee |
| 5,969,441 A | 10/1999 | Loopstra et al. |
| 6,051,843 A | 4/2000 | Nishi |
| 6,191,429 B1 | 2/2001 | Suwa |
| 6,195,154 B1 | 2/2001 | Imai |
| 6,208,407 B1 | 3/2001 | Loopstra |
| 6,279,881 B1 | 8/2001 | Nishi |
| 6,339,266 B1 | 1/2002 | Tanaka |
| 6,341,007 B1 | 1/2002 | Nishi et al. |
| 6,400,441 B1 | 6/2002 | Nishi et al. |
| 6,498,582 B1 | 12/2002 | Sweeney et al. |
| 6,549,269 B1 | 4/2003 | Nishi et al. |
| 6,549,277 B1 | 4/2003 | Narushima et al. |
| 6,590,634 B1 | 7/2003 | Nishi et al. |
| 6,867,844 B2 | 3/2005 | Vogel et al. |
| 6,940,582 B1 | 9/2005 | Tanaka |
| 7,242,455 B2 | 7/2007 | Nei et al. |
| 8,130,361 B2 | 3/2012 | Yasuda et al. |
| 2001/0019401 A1 | 9/2001 | Irie et al. |
| 2002/0041377 A1 | 4/2002 | Hagiwara et al. |
| 2002/0163629 A1 | 11/2002 | Switkes et al. |
| 2002/0172876 A1 | 11/2002 | Baselmans |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0257552 A1* | 12/2004 | Hansen ............... 355/55 |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesynchenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219489 A1 | 10/2005 | Nei et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesynchenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264778 A1 | 12/2005 | Lof et al. |
| 2005/0270505 A1 | 12/2005 | Smith |
| 2006/0082744 A1 | 4/2006 | Hirukawa |
| 2006/0103832 A1 | 5/2006 | Hazelton et al. |
| 2007/0103662 A1 | 5/2007 | Hazelton et al. |

FOREIGN PATENT DOCUMENTS

| | | |
|---|---|---|
| EP | 1 571 696 A1 | 9/2005 |
| JP | A-57-117238 | 7/1982 |
| JP | A-57-153433 | 9/1982 |
| JP | A-58-007823 | 1/1983 |
| JP | A 58-202448 | 11/1983 |

(56) References Cited

FOREIGN PATENT DOCUMENTS

| | | |
|---|---|---|
| JP | A 59-19912 | 2/1984 |
| JP | A-61-044429 | 3/1986 |
| JP | A 62-65326 | 3/1987 |
| JP | A 63-157419 | 6/1988 |
| JP | A 4-45512 | 2/1992 |
| JP | A-04-065603 | 3/1992 |
| JP | A 4-305915 | 10/1992 |
| JP | A 4-305917 | 10/1992 |
| JP | A 5-62877 | 3/1993 |
| JP | A-06-053120 | 2/1994 |
| JP | A 6-124873 | 5/1994 |
| JP | A 6-168866 | 6/1994 |
| JP | A-06-177005 | 6/1994 |
| JP | A-07-176468 | 7/1995 |
| JP | A 7-220990 | 8/1995 |
| JP | A-08-037149 | 2/1996 |
| JP | A-08-166475 | 6/1996 |
| JP | A 8-316125 | 11/1996 |
| JP | A-08-330224 | 12/1996 |
| JP | A 10-154659 | 6/1998 |
| JP | A-10-163099 | 6/1998 |
| JP | A-10-214783 | 8/1998 |
| JP | A 10-303114 | 11/1998 |
| JP | A 10-340846 | 12/1998 |
| JP | A-11-135400 | 5/1999 |
| JP | A 11-176727 | 7/1999 |
| JP | A 2000-58436 | 2/2000 |
| JP | A-2000-505958 | 5/2000 |
| JP | A-2002-014005 | 1/2002 |
| JP | A 2004-207710 | 7/2004 |
| JP | A-2005-86030 | 3/2005 |
| WO | WO 99/49504 A1 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/053954 A2 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, 3$^{rd}$ 157 nm symposium, Sep. 4, 2002, "Nikon F2 Exposure Tool", Soichi Owa et al., 25 pages (slides 1-25).
Nikon Corporation, Immersion Lithography Workshop, Dec. 11, 2002, 24 pages (slides 1-24).
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, :Potential performance and feasibility of immersion lithography, Soichi Owa et al., 33 pages, slides 1-33.
Chinese Office Action for Application No. 200910129713.7; mailed Mar. 23, 2010 (with translation).
Search Report and Written Opinion for Singapore Patent Application No. 200807578-0; mailed May 31, 2010.
Oct. 8, 2008 European Office Action in European Application No. 04773783.8.
Oct. 1, 2007 Australian Written Opinion in Singapore Application No. 200601863-4.
Jul. 2, 2008 Australian Examination Report in Singapore Application No. 200601863-4.
Dec. 29, 2009 Israeli Office Action in Israeli Application No. 174854, with translation.
Nov. 4, 2009 Office Action in Japanese Application No. 2004-296379, with translation.
Feb. 2, 2010 Office Action in Japanese Application No. 2004-296379, with translation.
May 6, 2010 Decision to Grant a Patent in Japanese Application No. 2004-296379, with translation.
Jan. 25, 2008 Office Action in Chinese Application No. 200480029466.9, with translation.
Sep. 5, 2008 Office Action in Chinese Application No. 200480029466.9, with translation.
Jan. 3, 2011 Office Action in Singapore Application No. 200807578-0.
Jul. 4, 2008 Supplementary European Search Report in European Application No. 04773783.8.
Jan. 25, 2011 Office Action in Chinese Application No. 200910129713.7, with translation.
Office Action issued in Korean Patent Application No. 2006-7006560 on Apr. 21, 2011 (with English translation).
Office Action issued in Israel Patent Application No. 174854 on May 31, 2011 (with partial English translation).
Jul. 13, 2011 Office Action issued in EP Application No. 04 773 783.8.

(56) References Cited

OTHER PUBLICATIONS

Nov. 17, 2011 Office Action issued in Taiwan Application No. 093130706 (with English translation).

Feb. 1, 2005 International Search Report issued in PCT/JP2004/015332 (with English translation).

Mar. 8, 2007 Office Action issued in U.S. Appl. No. 11/399,537.

Jan. 10, 2008 Notice of Allowance issued in U.S. Appl. No. 11/399,537.

Jul. 14, 2008 Notice of Allowance issued in U.S. Appl. No. 11/399,537.

Nov. 12, 2008 Office Action issued in U.S. Appl. No. 11/399,537.

Jan. 2, 2009 Office Action issued in U.S. Appl. No. 11/399,537.

Oct. 28, 2009 Restriction/Election Requirement issued in U.S. Appl. No. 11/399,537.

Mar. 8, 2010 Office Action issued in U.S. Appl. No. 11/399,537.

Oct. 6, 2010 Notice of Allowance issued in U.S. Appl. No. 11/399,537.

Jan. 20, 2011 Office Action issued in U.S. Appl. No. 11/399,537.

Oct. 14, 2011 Notice of Allowance issued in U.S. Appl. No. 11/399,537.

Jun. 21, 2013 Office Action issued in Chinese Patent Application No. 201110302682.8 (with translation).

Feb. 13, 2012 Invitation pursuant to Article 94(3) and Rule 71(1) issued in European Application No. 04773783.8.

Sep. 30, 2013 Search Report issued in European Patent Application No. 10186748.9.

Dec. 4, 2013 Office Action issued in Chinese Patent Application No. 201110302682.8 (with translation).

Feb. 1, 2005 Written Opinion issued in International Application No. PCT/JP2004/015332 (with translation).

May 6, 2014 Office Action issued in Chinese Patent Application No. 201110302682.8 (with translation).

* cited by examiner

EXPOSURE APPARATUS, EXPOSURE METHOD, AND METHOD FOR PRODUCING DEVICE

CROSS-REFERENCE

This is a divisional of U.S. patent application Ser. No. 11/399,537 filed Apr. 7, 2006 (now U.S. Pat. No. 8,130,361), which in turn is a continuation of International Application No. PCT/JP2004/015332 filed Oct. 12, 2004 claiming the conventional priority of Japanese patent Application No. 2003-350628 filed on Oct. 9, 2003 and No. 2004-045103 filed on Feb. 20, 2004. The disclosures of each of the prior applications are incorporated herein by reference in their entireties.

TECHNICAL FIELD

1. Field of the Invention

The present invention relates to an exposure apparatus, an exposure method, and a method for producing a device in which a substrate is exposed with a pattern via a projection optical system and a liquid.

2. Description of the Related Art

Microdevices such as semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage.

The microdevice is formed by overlaying a plurality of layers of patterns on the substrate. Therefore, when the pattern of the second layer or the following layer is projected onto the substrate to perform the exposure, it is important to accurately perform the alignment process in which the pattern having been already formed on the substrate is positionally adjusted to the image of the pattern of the mask to be subjected to the exposure next time. The alignment system includes the so-called TTL system in which the projection optical system is used as a part of the mark-detecting system, and the so-called off-axis system in which an exclusive mark-detecting system is used not via the projection optical system. In the case of these systems as described above, the positional adjustment is not performed directly for the mask and the substrate, but the positional adjustment is performed indirectly by the aid of a reference mark provided in the exposure apparatus (generally provided on the substrate stage). In particular, in the case of the off-axis system, the baseline measurement is performed to measure the baseline amount (information) which is the distance (positional relationship) between the detection reference position of the exclusive mark-detecting system and the projection position of the image of the pattern of the mask in a coordinate system which defines the movement of the substrate stage. When the overlay exposure is performed for the substrate, for example, the following operation is performed. That is, an alignment mark, which is formed in the shot area as the exposure objective area on the substrate, is detected by the mark-detecting system to determine the position information (deviation or discrepancy) of the shot area with respect to the detection reference position of the mark-detecting system. The substrate stage is moved from the position of the substrate stage obtained at that time by the baseline amount and the amount of the deviation of the shot area determined by the mark-detecting system. Accordingly, the projection position of the image of the pattern of the mask and the shot area are subjected to the positional adjustment, and the exposure is performed in this state. In this way, the image of the pattern of the next mask can be overlaid on the pattern which has been already formed on the substrate (shot area).

In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

Of course, it is also important for the liquid immersion exposure process that the positional adjustment is accurately performed between the image of the pattern of the mask and the respective shot areas on the substrate. It is important that the baseline measurement and the alignment process can be performed accurately when the positional adjustment between the substrate and the image of the pattern of the mask is indirectly performed via the reference mark as described above.

Further, not only the reference mark but also various types of sensors and the like are arranged around the surface of the substrate stage. When such an instrument is used, it is necessary to avoid the leakage and the inflow of the liquid as much as possible. Any inconvenience may possibly arise as well due to the inflow of the liquid into the substrate stage. Therefore, it is necessary to avoid the inflow of the liquid.

SUMMARY OF THE INVENTION

The present invention has been made taking the foregoing circumstances into consideration, an object of which is to provide an exposure apparatus and an exposure method which make it possible to suppress the leakage and the inflow of the liquid. Another object of the present invention is to provide an exposure apparatus and an exposure method which make it possible to accurately perform the alignment process even in the case of the liquid immersion exposure. Still another object of the present invention is to provide a method for producing a device using the exposure apparatus, and a method for producing a device using the exposure method.

In order to achieve the objects as described above, the present invention adopts the following constructions.

According to a first aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which is movable while holding the substrate; a first detecting system which detects an alignment mark on the substrate held by the substrate stage and which detects a reference provided on the substrate stage; and a second detecting system which detects the reference provided on the substrate stage via the projection optical system; wherein the reference, which is provided on the substrate stage, is detected not through the liquid by using the first detecting system, and the reference, which is provided on the substrate stage, is detected via the projection optical system and the liquid by using the second detecting system to determine a positional relationship between a detection reference position of the first detecting system and a projection position of the image of the pattern.

According to the present invention, when the reference on the substrate stage is detected by the first detecting system, the detection is performed not through the liquid. Accordingly, the reference can be detected satisfactorily without being affected, for example, by the temperature change of the liquid. It is unnecessary to construct the first detecting system so that the first detection signal is adapted to the liquid immersion. It is possible to use any conventional detecting system as it is. When the reference on the substrate stage is detected by using the second detecting system, the detection is performed via the projection optical system and the liquid while filling the space on the image plane side of the projection optical system with the liquid, in the same manner as in the liquid immersion exposure. Accordingly, it is possible to accurately detect the projection position of the image of the pattern on the basis of the detection result. The baseline amount (baseline information), which is the positional relationship (distance) between the detection reference position of the first detecting system and the projection position of the image of the pattern, can be accurately determined on the basis of the respective pieces of the position information about the substrate stage during the detection operations of the first and second detecting systems. The substrate (shot area) and the image of the pattern of the mask can be accurately subjected to the positional adjustment on the basis of the baseline amount when the overlay exposure is performed for the substrate as well.

According to a second aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which has a substrate holder for holding the substrate and which is movable while holding the substrate on the substrate holder; a first detecting system which detects an alignment mark on the substrate held by the substrate stage; and a second detecting system which detects a reference provided on the substrate stage through the liquid; wherein the substrate or a dummy substrate is arranged on the substrate holder when the reference provided on the substrate stage is detected through the liquid by using the second detecting system.

According to the present invention, it is possible to avoid any inflow of a large amount of the liquid into the substrate holder and/or into the substrate stage by arranging the substrate or the dummy substrate on the substrate holder even when the detection is performed in a state in which the liquid is arranged or disposed on the reference. Therefore, it is possible to avoid the occurrence of any inconvenience including, for example, the trouble and the electric leakage of the electric equipment included in the substrate stage and the rust of respective members included in the substrate stage which would be otherwise caused by the inflowed liquid.

According to a third aspect of the present invention, there is provided an exposure apparatus which exposes a substrate by projecting an image of a pattern onto the substrate through a liquid; the exposure apparatus comprising a projection optical system which projects the image of the pattern onto the substrate; a reference member which has an upper surface having no difference in level; and a detecting system which detects a reference formed on the reference member in a state in which a space between an end surface of the projection optical system and the upper surface of the reference member is filled with the liquid.

According to the present invention, the upper surface of the reference member has no difference in level. Therefore, any bubble hardly remains at the reference mark portion (level difference portion) on the reference member, for example, even when the dry state is switched into the wet state. The liquid is prevented from remaining at the mark portion as well when the wet state is switched into the dry state. Therefore, it is also possible to avoid the occurrence of any water trace (so-called water mark) on the reference member.

According to a fourth aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which has a substrate holder for holding the substrate and which is movable while holding the substrate on the substrate holder; a detector which detects whether or not the substrate or a dummy substrate is held by the substrate holder; and a control unit which changes a movable area of the substrate stage depending on a detection result obtained by the detector.

According to the present invention, the movable area of the substrate stage is determined depending on whether or not the substrate or the dummy substrate is held by the substrate holder. Therefore, it is possible to avoid the adhesion of the liquid to the holding surface of the substrate holder, and it is possible to avoid the inflow of the liquid into the substrate stage.

According to a fifth aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which has a substrate holder for holding the substrate and which is movable while holding the substrate on the substrate holder; a liquid supply mechanism which supplies the liquid; a detector which detects whether or not the substrate or a dummy substrate is held by the substrate holder; and a control unit which controls operation of the liquid supply mechanism on the basis of a detection result obtained by the detector.

According to the present invention, the operation of the liquid supply mechanism is controlled depending on whether or not the substrate or the dummy substrate is held by the substrate holder. Therefore, it is possible to avoid the adhesion of the liquid to the holding surface of the substrate holder, and it is possible to avoid the inflow of the liquid into the substrate stage.

According to a sixth aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which has a substrate holder for holding the substrate and which is movable while holding the substrate on the substrate holder; and a liquid supply mechanism which supplies the liquid onto the substrate stage only when the substrate or a dummy substrate is held on the substrate holder.

According to the present invention, the liquid supply mechanism supplies the liquid onto the substrate stage only when the substrate or the dummy substrate is held on the substrate holder. Therefore, it is possible to avoid the adhesion of the liquid to the holding surface of the substrate holder, and it is possible to avoid the inflow of the liquid into the substrate stage.

According to a seventh aspect of the present invention, there is provided an exposure apparatus which exposes a substrate by projecting an image of a pattern onto the substrate through a liquid; the exposure apparatus comprising a projection optical system which projects the image of the pattern onto the substrate; a substrate stage which is movable while holding the substrate; and a liquid immersion mechanism which forms a liquid immersion area on the substrate stage only when the substrate or a dummy substrate is held by the substrate stage.

According to the exposure apparatus of the seventh aspect, the liquid immersion mechanism does not form the liquid immersion area on the substrate stage when the substrate or the dummy substrate is not held on the substrate stage. Therefore, it is possible to effectively avoid the inflow of the liquid into the substrate stage.

According to an eighth aspect of the present invention, there is provided an exposure apparatus which exposes a substrate by projecting an image of a pattern onto the substrate through a liquid; the exposure apparatus comprising a projection optical system which projects the image of the pattern onto the substrate; and a substrate stage which has a recess for holding the substrate and a flat portion arranged around the recess, the flat portion being substantially flush with a surface of the substrate held by the recess; wherein an object is arranged in the recess on the substrate stage, and a liquid immersion area is formed on the substrate stage only when a surface of the object is substantially flush with the flat portion.

According to the exposure apparatus of the eighth aspect, the liquid immersion area is not formed on the substrate stage when the object is not accommodated in the recess of the substrate stage or when the object is not accommodated in the recess reliably. Accordingly, it is possible to effectively avoid the inflow of the liquid into the substrate stage.

According to a ninth aspect of the present invention, there is provided an exposure apparatus which exposes a substrate by projecting an image of a pattern onto the substrate through a liquid; the exposure apparatus comprising a projection optical system which projects the image of the pattern onto the substrate; a stage which is movable on an image plane side of the projection optical system; a first detecting system which detects an alignment mark on the substrate and which detects a reference provided on the stage; and a second detecting system which detects the reference provided on the stage via the projection optical system; wherein the reference provided on the stage is detected not through the liquid by using the first detecting system, and the reference provided on the stage is detected via the projection optical system and the liquid by using the second detecting system to determine a positional relationship between a detection reference position of the first detecting system and a projection position of the image of the pattern.

According to the ninth aspect of the present invention, it is possible to accurately perform the positional adjustment for the substrate (shot area) and the image of the pattern.

According to a tenth aspect of the present invention, there is provided an exposure method for exposing a substrate by projecting an image of a pattern onto the substrate via a projection optical system and a liquid; the exposure method comprising detecting position information about an alignment mark on the substrate by using a first detecting system; detecting position information about a reference on a substrate stage which holds the substrate, by using the first detecting system; and detecting the reference on the substrate stage via the projection optical system and the liquid by using a second detecting system after completion of both of detection of the position information about the alignment mark and detection of the position information about the reference on the substrate stage by the first detecting system; wherein a relationship between a detection reference position of the first detecting system and a projection position of the image of the pattern is determined on the basis of a detection result of the position information about the alignment mark obtained by the first detecting system, a detection result of the position information about the reference on the substrate stage obtained by the first detecting system, and a detection result of the position information about the reference on the substrate stage obtained by the second detecting system, and the image of the pattern and the substrate are subjected to positional adjustment to successively project the image of the pattern onto each of a plurality of shot areas on the substrate to expose the substrate.

According to this exposure method, the position information about the plurality of shot areas on the substrate is firstly determined by detecting the alignment mark on the substrate by the first detecting system not through the liquid. Subsequently, the reference on the substrate stage is detected not through the liquid to determine the position information thereof. Subsequently, the space on the image plane side of the projection optical system is filled with the liquid and the projection position of the image of the pattern is determined by detecting the reference on the substrate stage by the second detecting system via the projection optical system and the liquid. The baseline amount, which is the positional relationship (distance) between the detection reference position of the first detecting system and the projection position of the image of the pattern, is accurately determined. After that, the space between the projection optical system and the substrate is filled with the liquid to perform the liquid immersion exposure for the substrate. Therefore, it is possible to decrease the number of times of the switching operations between the dry state in which the space on the image plane side of the projection optical system is not filled with the liquid and the wet state in which the space on the image plane side of the projection optical system is filled with the liquid. Thus, it is possible to improve the throughput. The operation for detecting the reference by the first detecting system and the operation for detecting the reference by the second detecting system via the projection optical system and the liquid are continuously performed. Therefore, it is possible to avoid the inconvenience which would be otherwise caused such that the detection state, which is brought about during the operation for detecting the reference by the second detecting system, is greatly varied from the detection state which is brought about during the operation for detecting the reference by the first detecting system, and the baseline amount, which is the positional relationship between the detection reference position of the first detecting system and the projection position of the image of the pattern, cannot be measured accurately. The reference can be satisfactorily detected without being affected, for example, by the temperature change of the liquid by performing the detection not through the liquid when the reference on the substrate stage is detected by the first detecting system. Further, it is unnecessary that the first detecting system is constructed to be adapted to the liquid immersion. It is possible to use any conventional detecting system as it is. When the reference on the substrate stage is detected by using the second detecting system, the detection is performed via the projection optical system and the liquid while filling the space on the image plane side of the projection optical system with the liquid in the same manner as in the liquid immersion exposure. Accordingly, it is possible to accurately detect the projection position of the image of the pattern on the basis of the detection result. The baseline amount, which is the positional relationship (distance) between the detection reference position of the first detecting system and the projection position of the image of the pattern, can be accurately determined on the basis of the respective pieces of position information about the substrate stage during the detecting operations of the first and second detecting systems. The substrate (shot area) and the image of the pattern of the mask can be accurately subjected to the positional adjustment on the basis of the baseline amount even when the overlay exposure is performed for the substrate.

According to an eleventh aspect of the present invention, there is provided an exposure method for exposing a substrate by projecting an image of a pattern onto the substrate through a liquid; the exposure method comprising detecting an alignment mark on the substrate held by a substrate stage provided with a reference and a substrate holder, by using a first detector; detecting the reference through the liquid by using a second detector in a state in which the substrate or a dummy substrate is arranged on the substrate holder; and performing positional adjustment for the substrate and the image of the pattern on the basis of detection results obtained by the first and second detectors to expose the substrate with the image of the pattern.

According to the exposure method of the eleventh aspect of the present invention, the substrate or the dummy substrate is arranged on the substrate holder when the reference provided on the substrate stage is detected by the second detector through the liquid. Therefore, it is possible to effectively avoid the inflow of the liquid into the substrate stage.

According to a twelfth aspect of the present invention, there is provided an exposure method for exposing a substrate by projecting an image of a pattern through a liquid onto the substrate held by a substrate holder of a movable substrate stage; the exposure method comprising detecting whether or not the substrate or a dummy substrate is held by the substrate holder; and setting a movable area of the substrate stage depending on an obtained detection result.

According to the exposure method of the twelfth aspect of the present invention, the movable area of the substrate stage is set, for example, such that the interior of the substrate stage is prevented from any inflow of the liquid when it is detected that the substrate or the dummy substrate is not held by the substrate holder.

According to a thirteenth aspect of the present invention, there is provided an exposure method for exposing a substrate by projecting an image of a pattern through a liquid onto the substrate held by a movable substrate stage; the exposure method comprising detecting whether or not the substrate or a dummy substrate is held by the substrate stage; and judging whether or not a liquid immersion area is to be formed on the substrate stage depending on an obtained detection result.

According to the exposure method of the thirteenth aspect of the present invention, the supply of the liquid onto the substrate stage is stopped, for example, when it is detected that the substrate or the dummy substrate is not held by the substrate stage. Therefore, it is possible to avoid the inflow of the liquid into the substrate stage.

According to the present invention, there is provided a method for producing a device, comprising using the exposure apparatus as described above. According to the present invention, there is provided a method for producing a device, comprising using the exposure method as described above.

According to the present invention, the liquid immersion exposure process can be performed in a state in which the accurate positional adjustment is achieved for the substrate (shot area) and the projection position of the image of the pattern. Therefore, it is possible to produce the device which can exhibits the desired performance. The device having the desired performance can be produced by using the exposure apparatus which is capable of suppressing the leakage and the inflow of the liquid.

DESCRIPTION OF THE PREFERRED EMBODIMENTS OF THE INVENTION

The exposure apparatus according to the present invention will be explained below with reference to the drawings. However, the present invention is not limited thereto.

Figure 1:
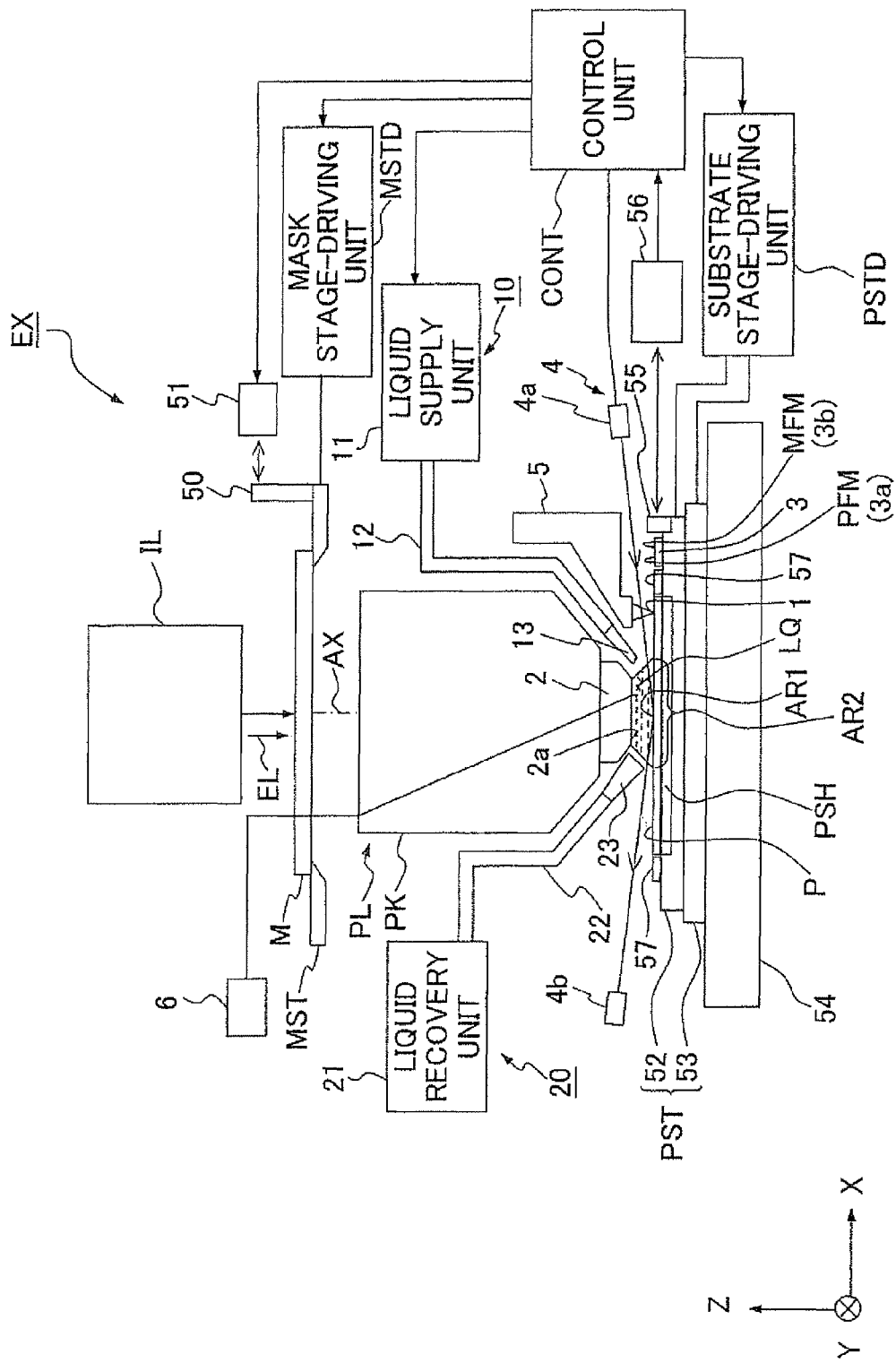
FIG. 1 shows a schematic arrangement illustrating an embodiment of an exposure apparatus of the present invention.

FIG. 1 shows a schematic arrangement illustrating an embodiment of an exposure apparatus of the present invention. With reference to FIG. 1, the exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs the projection exposure for the substrate P supported by the substrate stage PST with an image of a pattern of the mask M illuminated with the exposure light beam EL, and a control unit CONT which integrally controls the operation of the entire exposure apparatus EX.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid LQ onto the substrate P, and a liquid recovery mechanism 20 which recovers the liquid LQ from the substrate P. In this embodiment, pure water is used for the liquid LQ. The exposure apparatus EX forms a liquid immersion area AR2 (locally) on at least a part of the substrate P including a projection area AR1 of the projection optical system PL by the liquid LQ supplied from the liquid supply mechanism 10 at least during the period in which the image of the pattern of the mask M is transferred onto the substrate P. Specifically, the exposure apparatus EX is operated as follows. That is, the space between the surface (exposure surface) of the substrate P and the optical element 2 disposed at the end portion of the projection optical system PL is filled with the liquid LQ. The image of the pattern of the mask M is projected onto the substrate P to expose the substrate P therewith via the projection optical system PL and the liquid LQ between the projection optical system PL and the substrate P.

The embodiment of the present invention will be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions (predetermined directions). In the following explanation, the X axis direction is the synchronous movement direction (scanning direction, predetermined direction) for the mask M and the substrate P in the horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively.

The term "substrate" referred to herein includes those obtained by coating a semiconductor wafer surface with a resist, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid LQ is pure water in this embodiment, through which even the ArF exposure light beam as the exposure light beam EL is transmissive. Those also capable of being transmitted through pure water include the emission line (g-ray, h-ray, i-ray) in the ultraviolet region and the far ultraviolet light beam (DUV light beam) such as the KrF excimer laser beam (wavelength: 248 nm).

The mask stage MST is movable while holding the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50, which is movable together with the mask stage MST, is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including an optical element (lens) 2 provided at the end portion on the side of the substrate P. The optical elements are supported by a barrel PK. In this embodiment, the projection optical system PL is based on the reduction system having the projection magnification β which is, for example, ¼ or ⅕. The projection optical system PL may be any one of the 1× magnification system and the magnifying system. The projection optical system PL may be either a projection optical system of the cata-dioptric type including catoptric and dioptric elements or a projection optical system of the catoptric type including only a catoptric element. The optical element 2, which is disposed at the end portion of the projection optical system PL of this embodiment, is provided detachably (exchangeably) with respect to the barrel PK. The optical element 2, which is disposed at the end portion, is exposed from the barrel PK. The liquid LQ of the liquid immersion area AR2 makes contact with the optical element 2. Accordingly, the barrel PK, which is formed of metal, is prevented from any corrosion or the like.

The optical element 2 is formed of fluorite. Fluorite has a high affinity for water. Therefore, the liquid LQ is successfully allowed to make tight contact with substantially the entire surface of the liquid contact surface 2*a* of the optical element 2. That is, in this embodiment, the liquid (water) LQ, which has the high affinity for the liquid contact surface 2*a* of the optical element 2, is supplied. Therefore, the highly tight contact is effected between the liquid LQ and the liquid contact surface 2*a* of the optical element 2. The optical element 2 may be formed of quartz having a high affinity for water. A water-attracting (lyophilic or liquid-attracting) treatment may be performed to the liquid contact surface 2*a* of the optical element 2 to further enhance the affinity for the liquid LQ.

The exposure apparatus EX has a focus-detecting system 4. The focus-detecting system 4 includes a light-emitting section 4*a* and a light-receiving section 4*b*. A detecting light beam is radiated in an oblique direction from the light-emitting section 4*a* via the liquid LQ onto the surface (exposure surface) of the substrate P. A reflected light beam thereof is received by the light-receiving section 4*b*. The control unit CONT controls the operation of the focus-detecting system 4. Further, the control unit CONT detects the position (focus position) of the surface of the substrate P in the Z axis direction with respect to a predetermined reference plane on the basis of the light-receiving result of the light-receiving section 4*b*. When the focus positions are determined at a plurality of points on the surface of the substrate P respectively, the focus-detecting system 4 can also determine the posture of the substrate P in the inclined direction. A structure, which is disclosed, for example, in Japanese Patent Application Laid-open No. 8-37149, can be used for the focus-detecting system 4. The focus-detecting system 4 may also be of a type in which the detecting light beam is radiated onto the surface of the substrate P not through the liquid.

The substrate stage PST is movable while holding the substrate P. The substrate stage PST includes a Z stage 52 which holds the substrate P by the aid of a substrate holder PSH, and an XY stage 53 which supports the Z stage 52. The XY stage 53 is supported on a base 54. The substrate stage PST is driven by a substrate stage-driving unit PSTD such as a linear motor. The substrate stage-driving unit PSTD is controlled by the control unit CONT. It goes without saying that the Z stage and the XY stage are provided as an integrated body. The position of the substrate P in the XY directions (position in the direction substantially in parallel to the image plane of the projection optical system PL) is controlled by driving the XY stage 53 of the substrate stage PST.

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT positions the substrate P supported by the substrate stage PST in the X axis direction and the Y axis direction by driving the XY stage 53 by the aid of the substrate stage-driving unit PSTD in the two-dimensional coordinate system defined by the laser interferometer 56.

The control unit CONT controls the position (focus position) of the substrate P held by the Z stage 52 in the Z axis direction and the position in the $\theta X$ and $\theta Y$ directions by driving the Z stage 52 of the substrate stage PST by the aid of the substrate stage-driving unit PSTD. That is, the Z stage 52 is operated on the basis of the instruction from the control unit CONT based on the detection result of the focus-detecting system 4. The angle of inclination and the focus position (Z position) of the substrate P are controlled so that the surface (exposure surface) of the substrate P is adjusted to match the image plane to be formed via the projection optical system PL and the liquid LQ.

An auxiliary plate 57 is provided on the substrate stage PST (Z stage 52) so that the substrate P is surrounded thereby. The auxiliary plate 57 has a flat surface which has approximately the same height as that of the surface of the substrate P held by the substrate holder PSH. In this arrangement, a gap of about 0.1 to 2 mm is provided between the auxiliary plate 57 and the edge of the substrate P. However, the liquid LQ scarcely flows into the gap owing to the surface tension of the liquid LQ. Even when any portion in the vicinity of the circumferential edge of the substrate P is subjected to the exposure, the liquid LQ can be retained under the projection optical system PL by the aid of the auxiliary plate 57. The substrate holder PSH may be provided as another member separately from the substrate stage PST (Z stage 52). Alternatively, the substrate holder PSH may be provided integrally with the substrate stage PST (Z stage 52).

A substrate alignment system 5, which detects alignment marks 1 formed on the substrate P or a substrate side reference mark PFM formed on a reference member 3 provided on the Z stage 52, is provided in the vicinity of the end portion of the projection optical system PL. A mask alignment system 6, which detects a mask side reference mark MFM formed on the reference member 3 provided on the Z stage 52 via the mask M and the projection optical system PL, is provided in the vicinity of the mask stage MST. A structure, which is disclosed, for example, in Japanese Patent Application Laid-open No. 4-65603, can be used for the substrate alignment system 5. A liquid-repellent cover (not shown) is provided to avoid any adhesion of the liquid around the optical element disposed at the terminal end of the substrate alignment system 5 (optical element disposed most closely to the substrate P and the substrate stage PST). The surface of the optical element disposed at the terminal end of the substrate alignment system 5 is coated with a liquid-repellent material. The adhesion of the liquid LQ is avoided as well as an operator can easily wipe out the liquid even when the liquid adheres to the optical element disposed at the terminal end. A seal member such as a V-ring, which is provided in order to avoid any inflow of the liquid, is arranged between the optical element disposed at the terminal end of the substrate alignment system 5 and a metal fixture which holds the optical element. Those usable for the arrangement of the mask alignment system 6 include, for example, those disclosed in Japanese Patent Application Laid-open Nos. 7-176468 and 58-7823.

The liquid supply mechanism 10 includes a liquid supply unit 11 which is capable of supplying the predetermined liquid LQ onto the substrate P in order to form the liquid immersion area AR2 and feeding the liquid LQ, and supply nozzles 13 which are connected to the liquid supply unit 11 via a supply tube 12 and which have supply ports for supplying the liquid LQ, fed from the liquid supply unit 11, onto the substrate P. The supply nozzles 13 are arranged closely to the surface of the substrate P.

The liquid supply unit 11 includes, for example, a tank for accommodating the liquid LQ, and a pressurizing pump. The liquid supply unit 11 supplies the liquid LQ onto the substrate P via the supply tube 12 and the supply nozzles 13. The liquid supply operation of the liquid supply unit 11 is controlled by the control unit CONT. The control unit CONT is capable of controlling the liquid supply amount per unit time to the surface of the substrate P by the liquid supply unit 11. The liquid supply unit 11 further includes a temperature-adjusting mechanism for the liquid LQ. The liquid LQ, which has approximately the same temperature (for example, 23° C.) as the temperature in the chamber for accommodating the apparatus therein, is supplied onto the substrate P. It is not necessarily indispensable that the exposure apparatus EX is provided with the tank and the pressurizing pump which are used to supply the liquid LQ. It is also possible to utilize the equipment of a factory or the like in which the exposure apparatus EX is installed.

The liquid recovery mechanism 20 includes recovery nozzles 23 which recover the liquid LQ from the surface of the substrate P and which are arranged closely to the surface of the substrate P, and a liquid recovery unit 21 which is connected to the recovery nozzles 23 via a recovery tube 22. The liquid recovery unit 21 includes, for example, a vacuum system (suction unit) such as a vacuum pump, and a tank for accommodating the recovered liquid LQ. The liquid recovery unit 21 recovers the liquid LQ from the surface of the substrate P through the recovery nozzles 23 and the recovery tube 22. The liquid recovery operation of the liquid recovery unit 21 is controlled by the control unit CONT. The control unit CONT is capable of controlling the liquid recovery amount per unit time by the liquid recovery unit 21. It is not necessarily indispensable that the exposure apparatus EX is provided with the tank and the vacuum system for recovering the liquid LQ. It is also possible to utilize the equipment of a factory or the like in which the exposure apparatus EX is installed.

Figure 2:
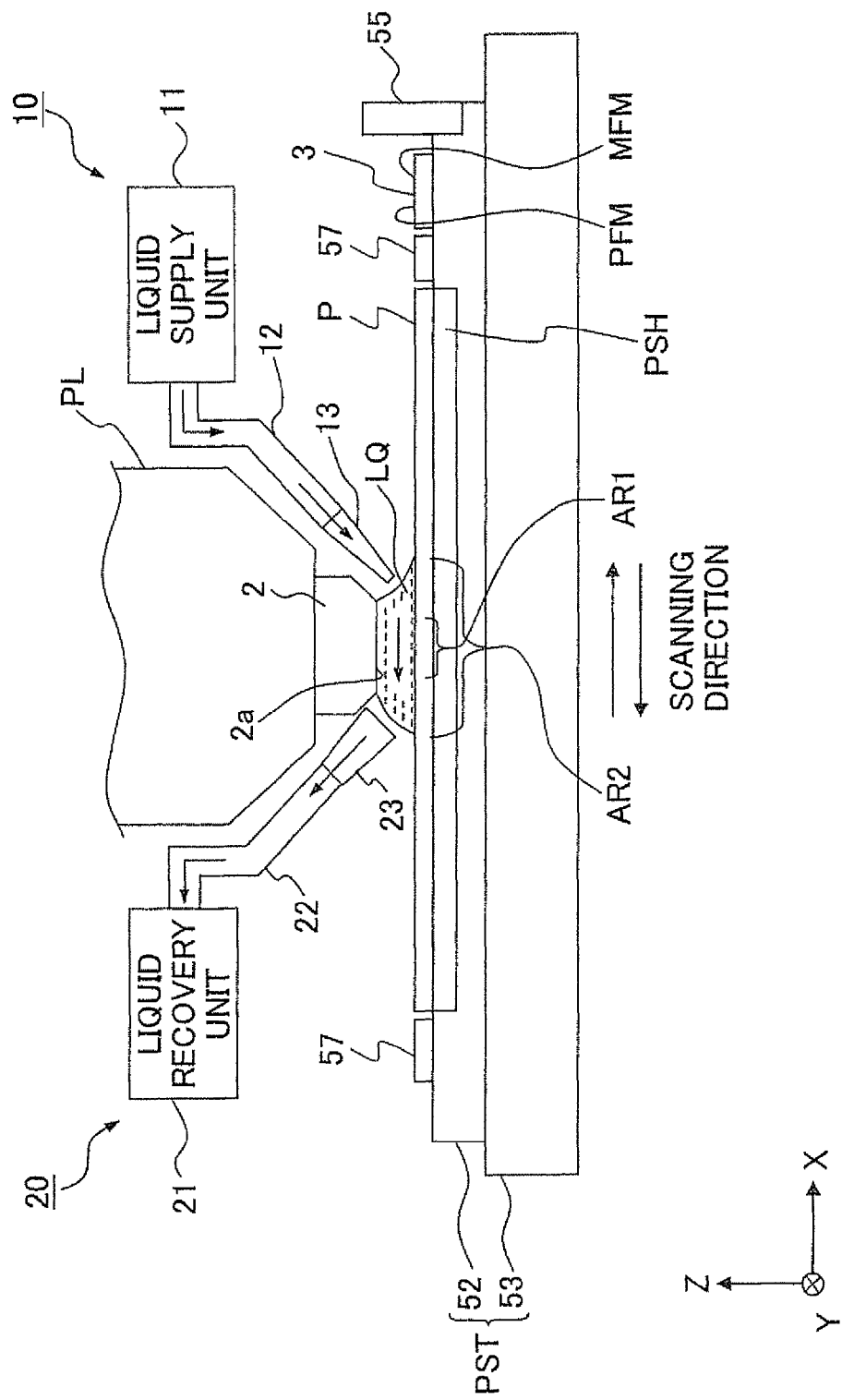
FIG. 2 shows a schematic arrangement illustrating a liquid supply mechanism and a liquid recovery mechanism.

FIG. 2 shows a front view illustrating those disposed in the vicinity of the end portion of the projection optical system PL of the exposure apparatus EX, the liquid supply mechanism 10, and the liquid recovery mechanism 20. During the scanning exposure, an image of a pattern of a part of the mask M is projected onto the projection area AR1 disposed just under the optical element 2 disposed at the end portion of the projection optical system PL. The mask M is moved at the velocity V in the −X direction (or in the +X direction) with respect to the projection optical system PL, in synchronization with which the substrate P is moved at the velocity β·V (β is the projection magnification) in the +X direction (or in the −X direction) via the XY stage 53. After the completion of the exposure for one shot area, the next shot area is moved to the scanning start position in accordance with the stepping of the substrate P. The exposure process is successively performed thereafter for each of the shot areas in the step-and-scan manner. This embodiment is designed so that the liquid LQ is flowed along with the movement direction of the substrate P.

Figure 3:
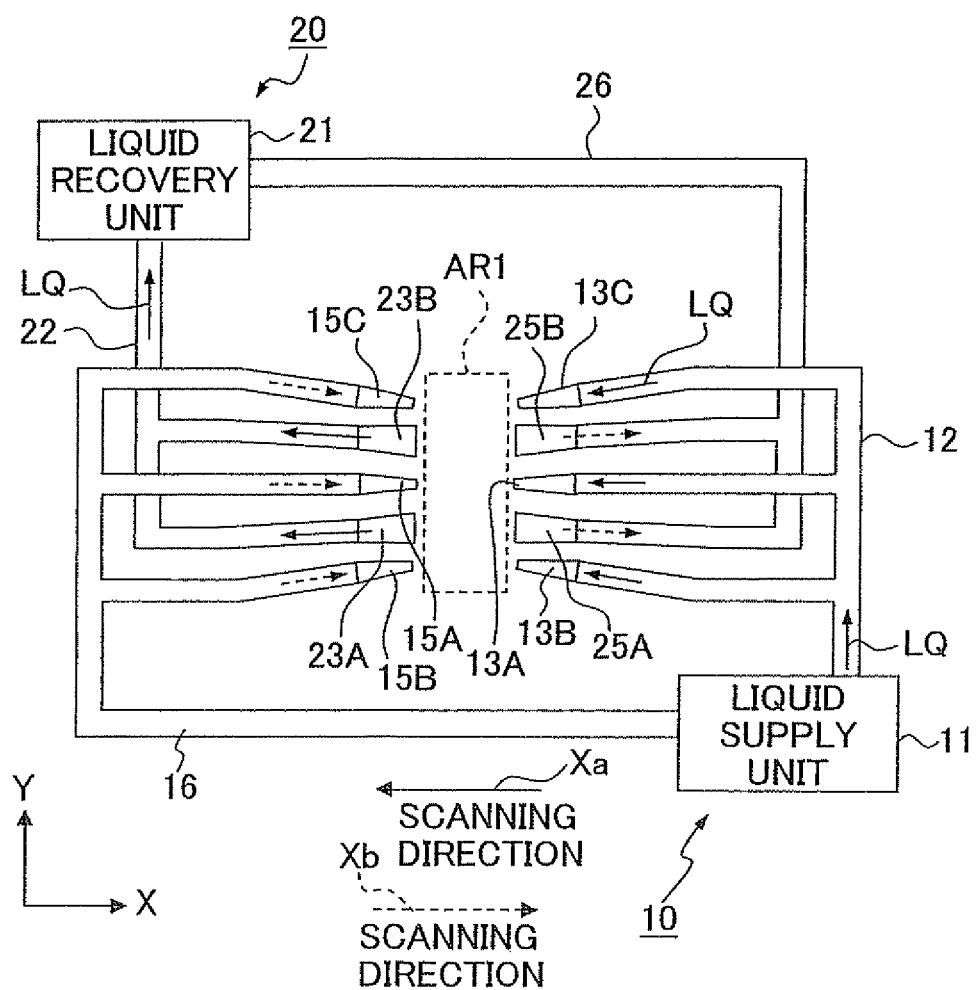
FIG. 3 shows a schematic plan view illustrating the liquid supply mechanism and the liquid recovery mechanism.

FIG. 3 shows the positional relationship among the projection area AR1 of the projection optical system PL, the supply nozzles 13 (13A to 13C) for supplying the liquid LQ in the X axis direction, and the recovery nozzles 23 (23A, 23B) for recovering the liquid LQ. In FIG. 3, the projection area AR1 of the projection optical system PL has a rectangular shape which is long in the Y axis direction. The three supply nozzles 13A to 13C are arranged on the side in the +X direction, and the two recovery nozzles 23A, 23B are arranged on the side in the −X direction so that the projection area AR1 is interposed thereby in the X axis direction. The supply nozzles 13A to 13C are connected to the liquid supply unit 11 via the supply tube 12, and the recovery nozzles 23A, 23B are connected to the liquid recovery unit 21 via the recovery tube 22. Further, the supply nozzles 15A to 15C and the recovery nozzles 25A, 25B are arranged in such a positional relationship that the positions of the supply nozzles 13A to 13C and the recovery nozzles 23A, 23B are rotated by substantially 180°. The supply nozzles 13A to 13C and the recovery nozzles 25A, 25B are alternately arranged in the Y axis direction. The supply nozzles 15A to 15C and the recovery nozzles 23A, 23B are alternately arranged in the Y axis direction. The supply nozzles 15A to 15C are connected to the liquid supply unit 11 via the supply tube 16. The recovery nozzles 25A, 25B are connected to the liquid recovery unit 21 via the recovery tube 26.

When the scanning exposure is performed by moving the substrate P in the scanning direction (−X direction) indicated by the arrow Xa, the liquid LQ is supplied and recovered with the liquid supply unit 11 and the liquid recovery unit 21 by using the supply tube 12, the supply nozzles 13A to 13C, the recovery tube 22, and the recovery nozzles 23A, 23B. That is, when the substrate P is moved in the −X direction, then the liquid LQ is supplied onto the substrate P from the liquid supply unit 11 through the supply tube 12 and the supply nozzles 13 (13A to 13C), and the liquid LQ is recovered to the liquid recovery unit 21 through the recovery nozzles 23 (23A, 23B) and the recovery tube 22. The liquid LQ flows in the −X direction so that the space between the projection optical system PL and the substrate P is filled therewith. On the other hand, when the scanning exposure is performed by moving the substrate P in the scanning direction (+X direction) indicated by the arrow Xb, then the liquid LQ is supplied and recovered with the liquid supply unit 11 and the liquid recovery unit 21 by using the supply tube 16, the supply nozzles 15A to 15C, the recovery tube 26, and the recovery nozzles 25A, 25B. That is, when the substrate P is moved in the +X direction, then the liquid LQ is supplied from the liquid supply unit 11 onto the substrate P through the supply tube 16 and the supply nozzles 15 (15A to 15C), and the liquid LQ is recovered to the liquid recovery unit 21 through the recovery nozzles 25 (25A, 25B) and the recovery tube 26. The liquid LQ flows in the +X direction so that the space between the projection optical system PL and the substrate P is filled therewith. As described above, the control unit CONT makes the liquid LQ to flow in the same direction as the movement direction of the substrate P in accordance with the movement direction of the substrate P by using the liquid supply unit 11 and the liquid recovery unit 21. In this arrangement, for example, the liquid LQ, which is supplied from the liquid supply unit 11 via the supply nozzles 13, flows so that the liquid LQ is attracted and introduced into the space between the projection optical system PL and the substrate P in accordance with the movement of the substrate P in the −X direction. Therefore, even when the supply energy of the liquid supply unit 11 is small, the liquid LQ can be supplied to the space between the projection optical system PL and the substrate P with ease. By switching the direction, in which the liquid LQ is made to flow, depending on the scanning direction, it is possible to fill the space between the substrate P and the projection optical system PL with the liquid LQ, and it is possible to obtain the high resolution and the wide depth of focus, even when the substrate P is subjected to the scanning in any one of the +X direction and the −X direction.

Figure 4:
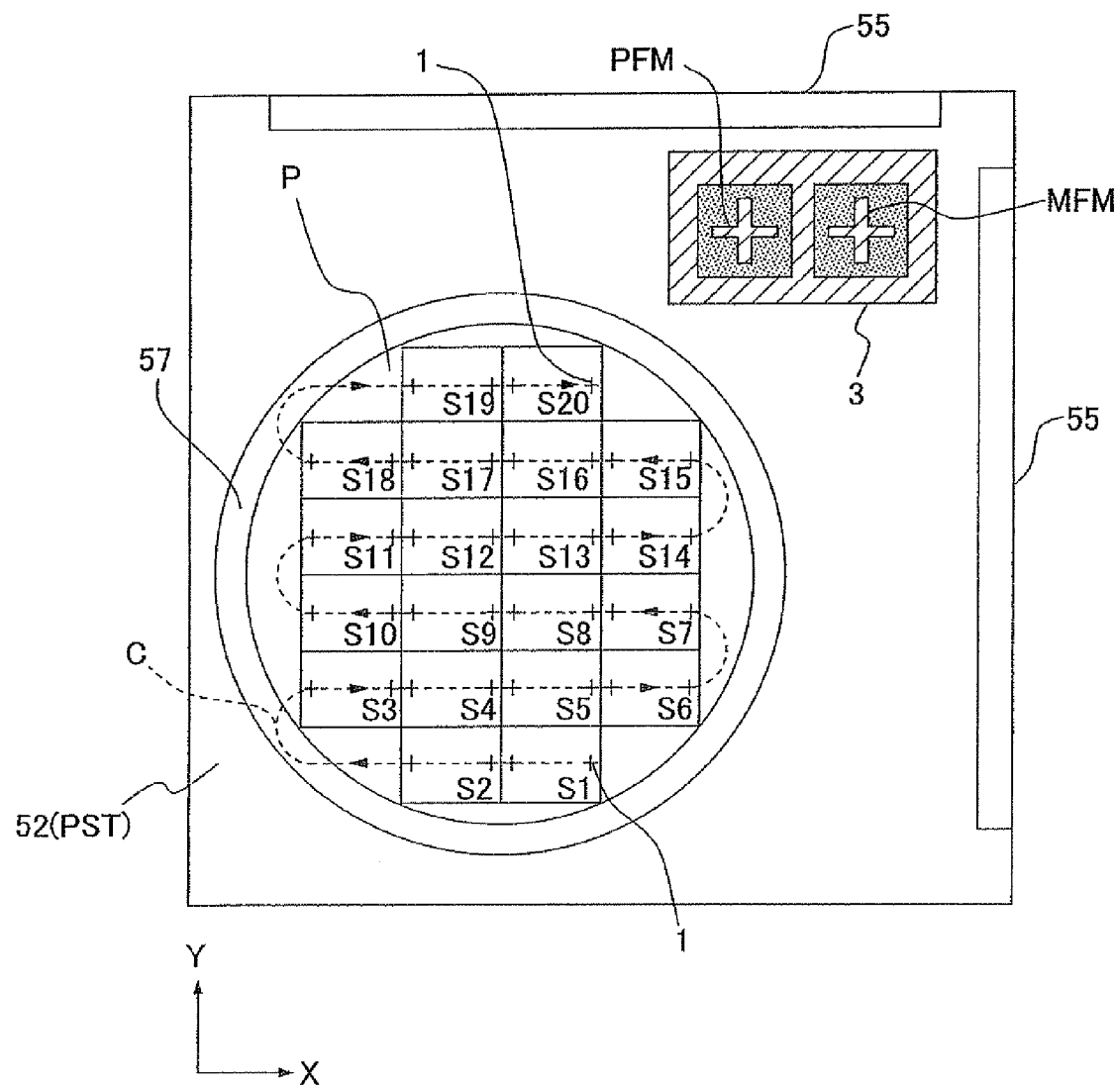
FIG. 4 shows a plan view illustrating a substrate stage.

FIG. 4 shows a schematic plan view illustrating the Z stage 52 of the substrate stage PST as viewed from an upper position. The movement mirrors 55 are arranged on the two side surfaces of the rectangular Z stage 52, the two side surfaces being perpendicular to each other. The substrate P is held at a substantially central portion of the Z stage 52 by the aid of the unillustrated substrate holder PSH. As described above, the auxiliary plate 57, which has the flat surface having approximately the same height as that of the surface of the substrate P, is provided around the substrate P. The plurality of shot areas S1 to S20 as the exposure objective areas are set in a matrix form on the substrate P. The alignment marks 1 are formed in attendance on the respective shot areas S1 to S20 respectively. The respective shot areas are depicted in FIG. 4 such that the respective shot areas are adjacent to one another. However, the respective shot areas are actually separated or away from each other. The alignment marks 1 are provided on scribe lines which are separation areas thereof.

The reference member 3 is provided at one corner of the Z stage 52. The reference member PFM to be detected by the substrate alignment system 5 and the reference member MFM to be detected by the mask alignment system 6 are arranged separately in a predetermined positional relationship on the reference member 3. An optical member such as a glass plate member is used for the base material for the reference member 3. The patterning is performed, for example, with mutually different materials (materials having different light reflectances) on the base material, and thus the reference marks PFM, MFM are formed. The reference marks PFM, MFM are formed so that they are free from any difference in level. The surface of the reference member 3 is substantially flat. Therefore, the surface of the reference member 3 can also serve as the reference surface for the focus-detecting system 4.

Figure 5A:
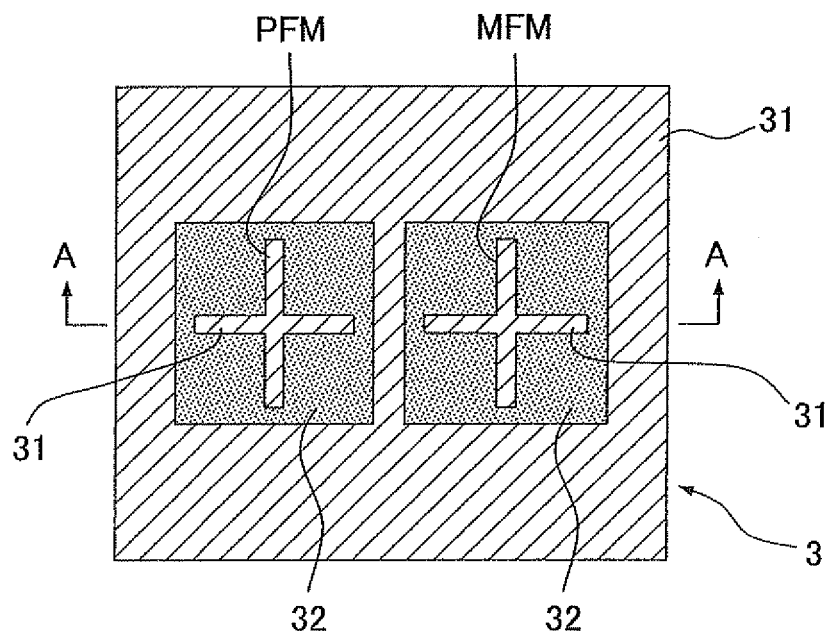
FIGS. 5A, 5B and 5C show a reference member.
Figure 5B:
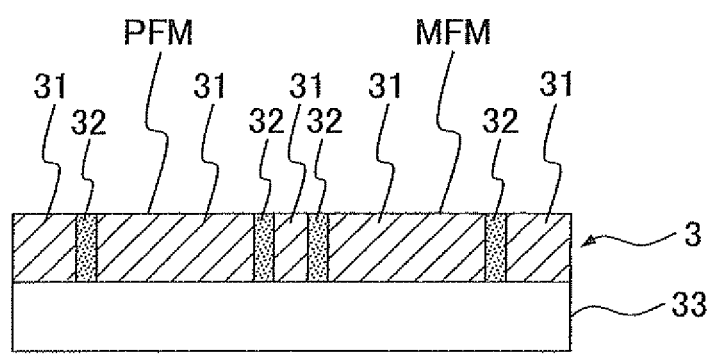

FIG. 5 shows the reference member 3, wherein FIG. 5A shows a plan view, and FIG. 53 shows a sectional view taken along the arrow A-A shown in FIG. 5A. The reference member 3 has a base member 33 which is formed of a glass plate member or the like, and a first material 31 and a second material 32 which are subjected to the patterning on the base member 33 and which have mutually different light reflectances. In this embodiment, the first material 31 is composed of chromium oxide ($Cr_2O_3$) having the low light reflectance, and the second material 32 is composed of chromium (Cr) having the light reflectance higher than that of the chromium oxide. The reference marks PFM, MFM, each of which is formed to be cross-shaped, are formed of chromium oxide. Chromium is arranged to surround the circumferences of the reference marks PFM, MFM. Further, chromium oxide is arranged in outer areas of the chromium. As for the materials to be used, there is no limitation to the combination of the materials as described above. For example, the first material may be composed of aluminum, and the second material may be composed of chromium. The reference marks PFM, MFM are level difference-free marks which are formed such that the upper surfaces of the reference marks PFM, MFM are free from any difference in level.

In order to form the level difference-free mark as described above, for example, a chromium oxide film is provided on the base member 33 by means of, for example, the vapor deposition, and then grooves are formed in a predetermined area of the chromium oxide film by means of, for example, the etching process. Chromium is provided in the grooves, and then the upper surface is subjected to the polishing process, for example, by means of the CMP process (chemical and mechanical polishing treatment). Accordingly, it is possible to form the level difference-free mark composed of chromium oxide and chromium. The level difference-free mark can be also formed such that grooves are formed on the base member 33, chromium or chromium oxide is embedded in the grooves, and then the polishing process is performed. Alternatively, the level difference-free mark can be also formed such that a material such as a photosensitive material, which is denatured or altered by the optical treatment (or the heat treatment), is coated on the base member 33, and the light (or the heat) is applied to an area corresponding to the reference mark to be formed so that the area is denatured (for example, discolored). Further alternatively, the upper surface of the reference member 3 can be also made free from any difference in level (flat) such that a mark is formed by means of, for example, the vapor deposition of a chromium film on the base member 33, and the surface thereof is subjected to the coating with a light-transmissive material such as quartz.

At least a part of the area of the upper surface of the reference member 3, which includes the reference marks PFM, MFM, is liquid-repellent (water-repellent). In this embodiment, the entire region of the upper surface of the reference member 3 is liquid-repellent. In this embodiment, the upper surface of the reference member 3 is liquid-repellent by performing the liquid-repelling treatment to apply the liquid repellence. The liquid-repelling treatment includes, for example, a coating treatment using a material having the liquid repellence. The material having the liquid repellence includes, for example, fluorine-based compounds, silicon compounds, and synthetic resins such as acrylic resins and polyethylene. The thin film, which is adopted for the surface treatment, may be either a single layer film or a film formed of a plurality of layers.

Figure 5C:
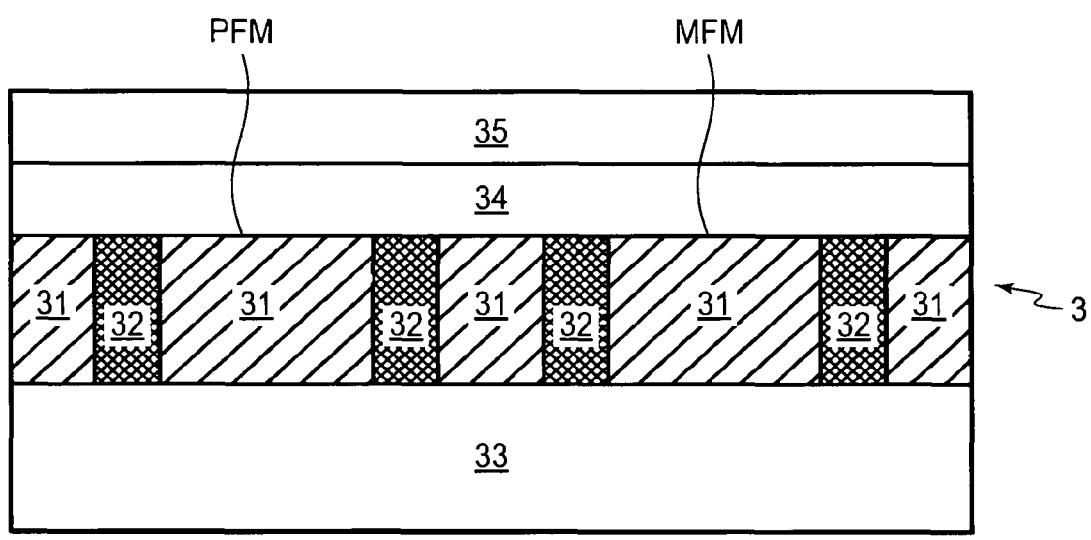

The upper surface of the reference member 3 may be also made liquid-repellent by using materials having liquid repellence as the first and second materials 31, 32 for forming the reference marks PFM, MFM. As shown in FIG. 5C, the reference member having the flat upper surface (free from any difference in level) can be also formed by forming the reference mark with a predetermined material such as chromium on a first glass plate member 33, overlapping a second glass plate member 34 thereon, and interposing the reference mark composed of chromium or the like between the first and second glass plate members. In this procedure, it is enough that the liquid-repelling treatment is performed to the second glass plate member 34 to form liquid-repellant material 35 on the second glass plate member 34. Therefore, it is possible to smoothly perform the liquid-repelling treatment.

In this embodiment, the reference marks PFM, MFM are formed to be cross-shaped. However, their shapes are not limited to the cross-shaped configurations. It is possible to use any mark shape most appropriate for each of the detecting systems. The reference marks PFM, MFM are illustrated while being emphasized. However, each of the reference marks PFM, MFM actually has a line width of about several μm. When a system as disclosed in Japanese Patent Application Laid-open No. 58-7823 is used as the mask alignment system 6, a light-transmitting portion is formed as the reference member MFM for the reference member 3. Also in this case, it is desirable that the upper surface of the reference member 3 is made to be free from any difference in level either by embedding a light-transmissive material such as quartz in the light-transmitting portion of the reference member 3 or by coating the upper surface of the reference member 3 with a light-transmissive material. As described above, the upper surface of the reference member 3 is used as the reference surface for the focus-detecting system 4. However, a reference surface of the focus-detecting system 4 may be provided on the Z stage 52 separately from the reference member 3. Further, the reference member 3 and the auxiliary plate 57 may be provided as an integrated body.

Next, an explanation will be made with reference to a flow chart shown in FIG. 6 about an example of the procedure for exposing the substrate P with the pattern of the mask M by using the exposure apparatus EX described above.

The substrate P is loaded on the substrate holder PSH of the Z stage 52, and the substrate holder PSH is made to hold the substrate P (see FIG. 1). The measurement process is firstly performed in a state in which the liquid LQ is absent on the substrate P before supplying the liquid LQ from the liquid supply mechanism 10. The control unit CONT moves the XY stage 53 while monitoring the output of the laser interferometer 56 so that the optical axis AX of the projection optical system PL is advanced along the broken line arrow C shown in FIG. 4. During the movement, the substrate alignment system 5 successively detects the plurality of alignment marks 1 formed on the substrate P accompanied with the shot areas S1 to S20 not through the liquid LQ (Step SA1).

When the substrate alignment system 5 detects the alignment mark, the XY stage 53 is stopped. The position of the substrate stage PST, which is provided when the substrate alignment system 5 detects the alignment mark 1, is measured by the laser interferometer 56. As a result, the position information about each of the alignment marks 1 in the coordinate system defined by the laser interferometer 56 is measured. The detection result of the position information about the alignment mark 1, which is detected by using the substrate alignment system 5 and the laser interferometer 56, is outputted to the control unit CONT. The FIA (Field Image Alignment) system is adopted for the substrate alignment system 5 of this embodiment, in which the illumination light beam such as the white light emitted from a halogen lamp is radiated onto the mark while allowing the substrate stage PST to stand still to photograph the obtained image of the mark in a predetermined image pickup field by an image pickup element, and the position of the mark is measured by means of the image processing.

The substrate alignment system 5 has the detection reference position in the coordinate system defined by the laser interferometer 56. The position information about the alignment mark 1 is detected as a deviation with respect to the detection reference position.

In this embodiment, the position information about the shot areas S1 to S20 is determined in accordance with the so-called EGA (Enhanced Global Alignment) system as disclosed, for example, in Japanese Patent Application Laid-open No. 61-44429. Therefore, the control unit CONT designates at least three areas (EGA shot areas) of the plurality of shot areas S1 to S20 formed on the substrate P. The alignment marks 1 accompanied with the respective shot areas are detected by using the substrate alignment system 5. The substrate alignment system 5 may detect all of the alignment marks 1 on the substrate P.

The information about the surface of the substrate P is detected by the focus-detecting system 4 not through the liquid LQ during the movement of the XY stage 53. The focus-detecting system 4 detects the deviation between the surface of the substrate P and the image formation plane of the image of the pattern formed via the projection optical system PL and the liquid LQ. The surface information is detected by the focus-detecting system 4 for each of all of the shot areas S1 to S20 on the substrate P. The detection result is stored in the control unit CONT while corresponding to the position of the substrate P in the scanning direction (X axis direction). The surface information may be detected by the focus-detecting system for only a part of the shot areas.

Subsequently, the control unit CONT determines the position information of each of the plurality of shot areas S1 to S20 on the substrate P by means of the calculation process (EGA process) on the basis of the detection results of the position information of the alignment marks 1 (Step SA2).

In the EGA system, the position information (coordinate position) of the alignment mark 1 accompanied with the EGA shot area designated in Step SA1 is detected by using the substrate alignment system 5, and then the error parameter (offset, scale, rotation, degree of perpendicularity) concerning the arrangement characteristic (position information) of the shot areas S1 to S20 on the substrate P is determined by performing the statistical calculation based on, for example, the least square method on the basis of the detected value and the designed value. The designed coordinate values are corrected for all of the shot areas S1 to S20 on the substrate P on the basis of the determined value of the parameter. Accordingly, the positional relationship is determined between the detection reference position of the substrate alignment system 5 and each of the shot areas on the substrate P placed on the substrate stage PST. That is, the control unit CONT can know, from the output of the laser interferometer 56, the position at which each of the shot areas on the substrate P is located with respect to the detection reference position of the substrate alignment system 5.

When the detection of the alignment mark 1 of the substrate P and the detection of the surface information of the substrate P are completed, the control unit CONT moves the XY stage 53 so that the detection area of the substrate alignment system 5 is positioned on the reference member 3. The substrate alignment system 5 detects the reference mark PFM on the reference member 3 in the absence of any liquid to detect the position information of the reference mark PFM in the coordinate system defined by the laser interferometer 56 (Step SA3).

The detection of the position information about the reference mark PFM by using the substrate alignment system 5 results in the detection of the positional relationship between the reference mark PFM and the detection reference position of the substrate alignment system 5 in the coordinate system defined by the laser interferometer 56.

After the completion of both of the detection of the position information about the alignment mark 1 using the substrate alignment system 5 and the detection of the position information about the reference mark PFM on the Z stage 52, the control unit CONT moves the XY stage 53 so that the reference mark MFM on the reference member 3 can be detected by the mask alignment system 6. The mask alignment system 6 observes the reference mark MFM via the projection optical system PL. Therefore, the end portion of the projection optical system PL is opposed to the reference member 3. In this situation, the control unit CONT starts the supply and the recovery of the liquid LQ by the liquid supply mechanism 10 and the liquid recovery mechanism 20. The space between the upper surface of the reference member 3 and the end surface of the optical element 2 disposed at the end portion of the projection optical system PL is filled with the liquid LQ to form the liquid immersion area. It is desirable that the liquid immersion area AR2 is formed on only the reference member 3. However, the liquid immersion area AR2 may be formed to range over the reference member 3 and the auxiliary plate 57. Alternatively, the liquid immersion area AR2 may be formed to range over the reference member 3, the auxiliary plate 57, and the substrate P.

Subsequently, the control unit CONT detects the reference member MFM via the mask M, the projection optical system PL, and the liquid LQ by the mask alignment system 6 (Step SA4).

Accordingly, the information about the projection position of the image of the pattern of the mask M on the XY plane is detected by using the reference mark MFM via the projection optical system PL and the liquid LQ. The positional relationship between the reference mark MFM and the projection position of the image of the pattern in the coordinate system defined by the laser interferometer 56 is measured. The mask alignment system 6 of this embodiment adopts the VRA (Visual Reticle Alignment) system in which the light beam is radiated onto the mark, and the image data of the mark obtained the image pickup with a CCD camera or the like is subjected to the image processing to detect the mark position.

The control unit CONT determines a baseline amount which is the spacing distance (positional relationship) between the detection reference position of the substrate alignment system 5 and the projection position of the image of the pattern (Step SA5).

Specifically, the positional relationship (baseline amount) between the detection reference position of the substrate alignment system 5 and the projection position of the image of the pattern in the coordinate system defined by the laser interferometer 5 is determined from the positional relationship between the reference mark PFM and the detection reference position of the substrate alignment system 5 determined in Step SA3, the positional relationship between the reference mark MFM and the projection position of the image of the pattern determined in Step SA4, and the predetermined positional relationship between the reference mark MFM (reference member 3b) and the reference mark PFM (reference member 3a).

When the measurement process is completed as described above, the control unit CONT stops the supply operation of the liquid LQ onto the reference member 3 having been performed by the liquid supply mechanism 10. On the other hand, the control unit CONT continues the recovery operation of the liquid LQ from the surface of the reference member 3 by the liquid recovery mechanism 20 for a predetermined period of time. After the elapse of the predetermined period of time, the control unit CONT stops the recovery operation having been performed by the liquid recovery mechanism 20. Accordingly, the liquid LQ is recovered from the surface of the reference member 3. It is preferable to adopt such an arrangement that the reference member 3 and the auxiliary plate 57 are provided as an integrated body, and the reference member 3b and the substrate P are continued at approximately the same height with the auxiliary plate 57 intervening therebetween. In this arrangement, the liquid immersion area of the liquid LQ can be moved from the reference member 3 to the substrate P in a state in which the liquid LQ is retained on the image plane side of the projection optical system PL without stopping the liquid supply operation performed by the liquid supply mechanism 10.

Subsequently, the control unit CONT drives the liquid supply mechanism 10 and the liquid recovery mechanism 20 in a state in which the projection optical system PL and the substrate P are opposed to each other to start the operation for supplying the liquid onto the substrate P and the operation for recovering the liquid from the surface of the substrate P. Accordingly, the liquid immersion area AR2 is formed between the projection optical system PL and the substrate P. After the liquid immersion area AR2 is formed on the substrate P, the plurality of shot areas on the substrate P are subjected to the liquid immersion exposure respectively by successively projecting the image of the pattern (Step SAG).

More specifically, the XY stage 53 is moved on the basis of the position information about the respective shot areas with respect to the detection reference position of the substrate alignment system 5 determined in Step SA2 and the positional relationship (baseline amount) between the detection reference position of the substrate alignment system 5 and the projection position of the image of the pattern determined in Step SA5. The respective shot areas are subjected to the liquid immersion exposure process while performing the positional adjustment between the image of the pattern and the respective shot areas S1 to S20 on the substrate P.

When the scanning exposure is performed for each of the shot areas S1 to S20 on the substrate P, the exposure process is performed by using the respective pieces of information determined during the measurement process as described above. That is, the respective shot areas are successively exposed while effecting the positional adjustment to the projection position of the image of the pattern on the basis of the arrangement (position information) of the shot areas determined in Step SA2. It is also allowable to use the so-called die-by-die system in which the alignment mark 1 in each of the shot areas on the substrate P is successively detected by the substrate alignment system 5 to perform the overlay exposure for the shot area. However, in this case, the liquid LQ is disposed on the substrate P during the exposure for the shot area on the substrate P, while the liquid LQ is not disposed on the substrate P during the detection of the alignment mark 1 by the substrate alignment system 5, and this operation is repeatedly performed. Therefore, it is preferable to adopt such a procedure that the arrangement (position information) of the shot areas is previously determined, and the substrate P is successively moved in accordance with the determined arrangement as in this embodiment.

During the scanning exposure for each of the shot areas S1 to S20, the positional relationship between the surface of the substrate P and the image plane formed through the liquid LQ is adjusted without using the focus-detecting system 4 on the basis of the surface information of the substrate P determined before the supply of the liquid LQ. The positional relationship between the image plane and the surface of the substrate P may be detected through the liquid LQ during the scanning exposure to perform the adjustment without determining the surface information of the substrate P before the supply of the liquid LQ. Alternatively, the both operations may be performed.

When the scanning exposure is completed for the respective shot areas S1 to S20 on the substrate P, the control unit CONT stops the liquid supply having been performed by the liquid supply mechanism 10. On the other hand, the control unit CONT continues the driving of the liquid recovery mechanism 20 for a predetermined period of time after the stop of the liquid supply by the liquid supply mechanism 10. Accordingly, the liquid LQ is recovered from the surface of the substrate P. When the liquid LQ is recovered from the surface of the substrate P, the liquid LQ may be recovered while relatively moving the substrate P and the recovery nozzles 23 of the liquid recovery mechanism 20 by driving the substrate stage PST.

When another substrate P' is held on the substrate stage PST to perform the exposure after the completion of the exposure of the substrate P, the shot area of the substrate P' and the projection position of the image of the pattern of the mask can be subjected to the positional adjustment without detecting the position information about the reference marks PFM, MFM on the substrate stage PST. In this procedure, the another substrate P' is held by the substrate holder PSH on the Z stage 52, and then the position information about the alignment mark 1 provided in attendance on the shot area is detected by using the substrate alignment system 5. Accordingly, the position information about each of the shot areas with respect to the detection reference position of the substrate alignment system 5 is determined by using the EGA process in the same manner as for the substrate P previously subjected to the exposure. Accordingly, the projection optical system PL can be opposed to the substrate P', each of the shot areas on the substrate P' and the image of the pattern can be subjected to the positional adjustment, and each of the shot areas on the substrate P' can be exposed with the image of the pattern.

When the plurality of substrate P (P') are successively exposed as described above, it is unnecessary that the operation for detecting the reference mark PFM, MFM to determine the baseline amount is performed every time when another substrate P' is held on the Z stage 52 (substrate holder PSH). The position information about the alignment mark 1 on the substrate P' held (loaded) on the Z stage 52 is detected, and the substrate P' is moved on the basis of the previously determined baseline amount. Accordingly, the substrate P' and the image of the pattern can be subjected to the positional adjustment efficiently and highly accurately. It is enough that the operation for detecting the reference mark PFM, MFM to determine the baseline amount is performed at every predetermined period of time, for example, every time when a preset number of the substrates are processed or every time when the mask is exchanged.

As described above, when the reference mark PFM on the Z stage 52 is detected by the substrate alignment system 5, the detection is performed not through the liquid LQ. Accordingly, the reference mark PFM can be satisfactorily detected without being affected, for example, by the temperature change of the liquid LQ. It is unnecessary that the substrate alignment system 5 is constructed so that the substrate alignment system 5 is adapted to the liquid immersion. It is possible to utilize any conventional detecting system as it is. When the reference mark MFM on the Z stage 52 is detected by using the mask alignment system 6, the detection is performed via the projection optical system PL and the liquid LQ while filling the space disposed on the image plane side of the projection optical system PL with the liquid LQ, in the same manner as in the liquid immersion exposure. Accordingly, it is possible to accurately detect the projection position of the image of the pattern on the basis of the detection result. The baseline amount, which is the positional relationship (distance) between the detection reference position of the substrate alignment system 5 and the projection position of the image of the pattern, can be accurately determined on the basis of the respective pieces of the position information about the substrate stage PST during the detection operations of the substrate alignment system 5 and the mask alignment system 6. The substrate P (shot areas S1 to S20) and the image of the pattern of the mask M can be accurately subjected to the positional adjustment on the basis of the baseline amount even when the overlay exposure is performed for the substrate P.

In this embodiment, the mark detection is performed by the mask alignment system 6 in the state in which the liquid LQ is disposed on the reference mark MFM (reference member 3). However, the substrate P is arranged on the substrate holder PSH of the Z stage 52 during the detection operation. Accordingly, even if the liquid LQ flows out from the surface of the reference member 3, it is possible to avoid the inflow of the liquid LQ into the substrate holder PSH and into the substrate stage PST. Even when the liquid immersion area AR2 protrudes from the inner edge of the auxiliary plate 57, it is possible to avoid the inflow of the liquid LQ into the substrate holder PSH and into the substrate stage PST. Therefore, it is possible to avoid the occurrence of any inconvenience including, for example, the trouble and/or the electric leakage of the electric equipment in the substrate stage PST and/or the rust on the respective members in the substrate stage PST which would be otherwise caused by the inflowed liquid LQ.

As described above, in this embodiment, the switching is effected between a wet state in which the liquid LQ is disposed on the reference member 3 and a dry state in which the liquid LQ is not disposed on the reference member 3 when the reference marks PFM, MFM on the reference member 3 are detected. However, as explained with reference to FIG. 5, the reference marks PFM, MFM, which are formed on the reference member 3, are free from any difference in level. Therefore, for example, even when the switching is effected from the dry state to the wet state, any bubble is hardly generated at the mark portion in the liquid LQ on the reference member 3. Even when the liquid LQ is recovered from the surface of the reference member 3 in order to effect the switching from the wet state to the dry state, then the liquid LQ can be recovered satisfactorily, and no liquid LQ remains at the mark portion. In particular, the liquid LQ can be recovered more satisfactorily, because the upper surface of the reference member 3 is liquid-repellent in this embodiment. Therefore, for example, the mask alignment system 6 can accurately perform the detection of the reference mark MFM without being affected by the bubble or the like. The substrate alignment system 5 can accurately perform the detection of the reference mark PFM without being affected by any remaining liquid LQ.

In this embodiment, the liquid LQ is not disposed on the reference member 3 when the reference mark PFM is detected by the substrate alignment system 5, and the liquid LQ is disposed on the reference member 3 when the reference mark MFM is detected by the mask alignment system 6. In this arrangement, the mask side reference mark MFM and the substrate side reference mark PFM are detected separately (not simultaneously). However, when the reference mark PFM and the reference mark MFM are sufficiently separated from each other on the reference member 3, and the portion of the reference mark PFM is not exposed to the liquid LQ, then the reference mark PFM may not be the level difference-free mark. Further, the mask side reference mark MFM and the substrate side reference mark PFM may be formed on different or distinct reference members. In this case, when the mask side reference mark MFM and the substrate side reference mark PFM are not detected simultaneously as in this embodiment, it is unnecessary to form the liquid immersion area on the reference member on which the reference mark PFM is formed. Therefore, it is unnecessary to make the adaptation to the liquid immersion, including, for example, the arrangement in which the reference mark PFM is free from any difference in level. Further, it is possible to avoid the occurrence of any water mark or the like as well.

This embodiment is constructed as follows. That is, the position information is firstly determined for the plurality of shot areas S1 to S20 on the substrate P by detecting the alignment marks 1 on the substrate P by the substrate alignment system 5 not through the liquid LQ (Steps SA1, SA2). Subsequently, the reference mark PFM on the substrate stage PST is detected not through the liquid LQ (Step SA3). Subsequently, the space on the image plane side of the projection optical system PL is filled with the liquid LQ, and the reference mark MFM is detected by the mask alignment system 6 via the projection optical system PL and the liquid LQ to thereby determine the projection position of the image of the pattern (Step SA4). The baseline amount, which is the positional relationship (distance) between the detection reference position of the substrate alignment system 5 and the projection position of the image of the pattern, is accurately determined (Step SA5). After that, the substrate P is subjected to the liquid immersion exposure (Step SA6). That is, in this procedure, the space on the image plane side of the projection optical system PL is not filled with the liquid LQ in Steps SA1 to SA3 described above, and the space on the image plane side of the projection optical system PL is filled with the liquid LQ in Steps SA4 to SA6 described above. Accordingly, it is possible to decrease the number of switching operations for switching the dry state in which the space on the image plane side of the projection optical system PL is not filled with the liquid LQ and the wet state in which the space on the image plane side of the projection optical system PL is filled with the liquid LQ, thereby improving the throughput. For example, when the wet state is switched to the dry state, it is necessary to perform the operation for removing the liquid LQ remaining, for example, on the upper surface of the reference member 3 after the switching. However, if the number of the switching operations is increased, then the number of the operations for removing the liquid is increased as well, and the process efficiency is lowered. However, when the number of the switching operations is reduced, it is possible to improve the throughput.

The reference mark PFM is detected by the substrate alignment system 5 (Step SA3), and then the alignment marks 1 on the substrate P are detected (Steps SA1, SA2). Subsequently, the reference mark MFM is detected by the mask alignment system 6 via the projection optical system PL and the liquid LQ (Steps SA4, SA5), and then the substrate P is subjected to the liquid immersion exposure process (Step SA6). Also in this way, it is possible to decrease the number of the switching operations between the dry state and the wet state in the same manner as in the embodiment of the present invention. On the other hand, as in the embodiment of the present invention, the operation for detecting the reference mark PFM by the substrate alignment system 5 and the operation for detecting the reference mark MFM by the mask alignment system 6 via the projection optical system PL and the liquid LQ are performed continuously. Therefore, it is possible to avoid the inconvenience which would be otherwise caused such that the detection state, which is brought about during the operation for detecting the reference mark MFM by the mask alignment system 6, is greatly varied from the detection state which is brought about during the operation for detecting the reference mark PFM by the substrate alignment system 5, and the baseline amount, which is the positional relationship between the detection reference position of the substrate alignment system 5 and the projection position of the image of the pattern, cannot be measured accurately. For example, there is a possibility of the occurrence of the physical fluctuation of the positional relationship between the projection optical system PL and the alignment system 5, the fluctuation of the optical characteristic of the alignment system 5, and the fluctuation of the environment (temperature) on the measuring optical path for the laser interferometer 56 to measure the position of the substrate stage PST, for example, due to any thermal fluctuation of the environment of the exposure apparatus caused, for example, by the difference in heat generation amount between the stopped state and the driving state of the linear motor for driving the stage. In such a situation, if the temporal interval is large between the timing of the operation for detecting the reference mark PFM by the substrate alignment system 5 and the timing of the operation for detecting the reference mark MFM by the mask alignment system 6, there is such a possibility that the inconvenience arises, in which the baseline amount cannot be measured accurately due to the thermal fluctuation. However, when the operation for detecting the reference mark PFM by the substrate alignment system 5 and the operation for detecting the reference mark MFM by the mask alignment system 6 are performed continuously as in the embodiment of the present invention, it is possible to avoid the inconvenience.

Figure 6:
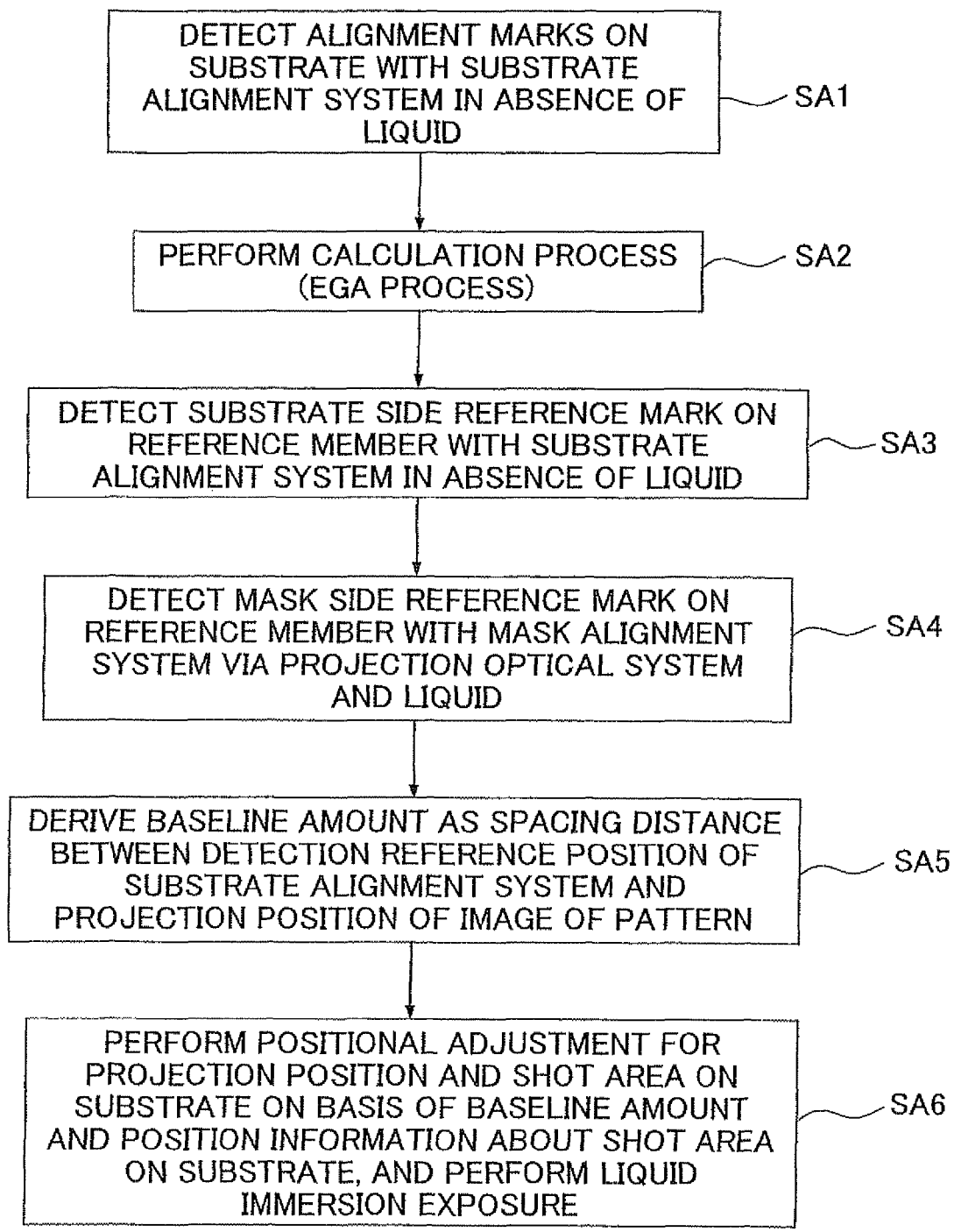
FIG. 6 shows a flow chart illustrating an embodiment of an exposure method of the present invention.

In the alignment sequence shown in the flow chart shown in FIG. 6, the following procedure is adopted. That is, the alignment marks 1 on the substrate P are detected not through the liquid (Step SA1) to perform the EGA process (Step SA2), and then the reference mark PFM is detected not through the liquid (Step SA3). After that, the detection of the reference mark MFM is executed via the projection optical system PL and the liquid (Step SA4). However, the order of Step SA2 and Step SA3 may be exchanged. In this case, the detection interval between the reference mark PFM and the reference mark MFM is somewhat longer than that of the sequence shown in FIG. 6. However, it is possible to perform a small number of times of the operations of the liquid supply and recovery in the same manner as in the sequence shown in FIG. 6. Therefore, this procedure is advantageous in view of the throughput. In the embodiment described above, the reference mark PFM and the reference mark MFM are provided separately. However, it is also allowable that one reference mark may be detected by the substrate alignment system 5 and the mask alignment system 6. Further, the detection of the reference mark PFM without any liquid and the detection of the reference mark MFM through the liquid may be executed to determine the baseline amount, and then the alignment marks 1 on the substrate P may be detected.

Figure 7:
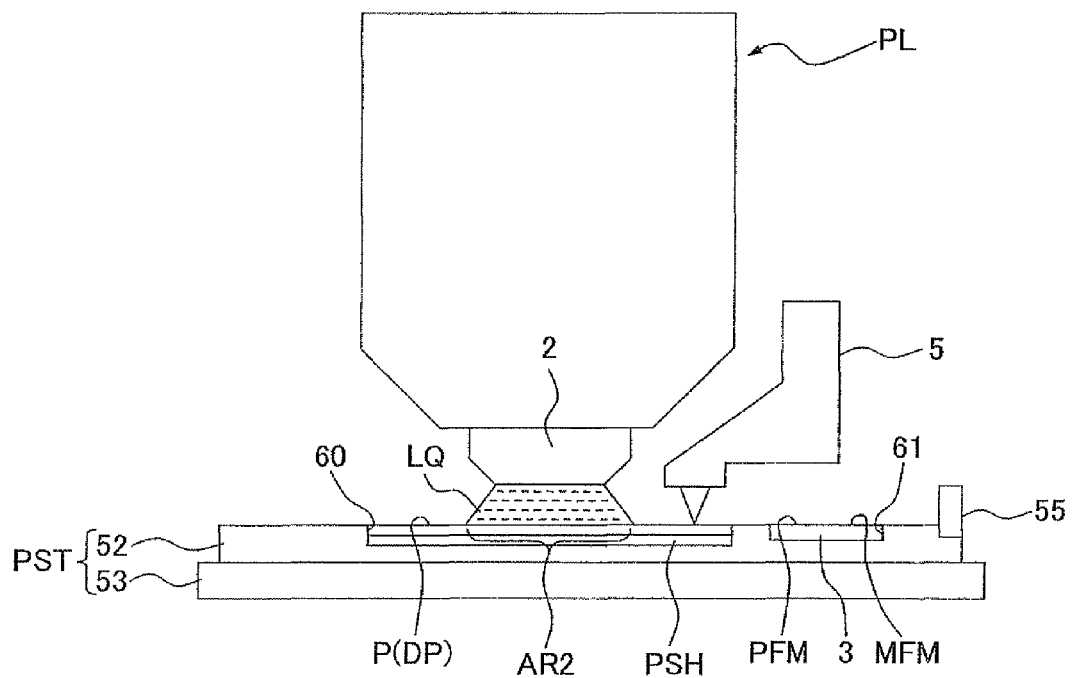
FIG. 7 schematically shows another embodiment of a substrate stage according to the present invention.
Figure 8:
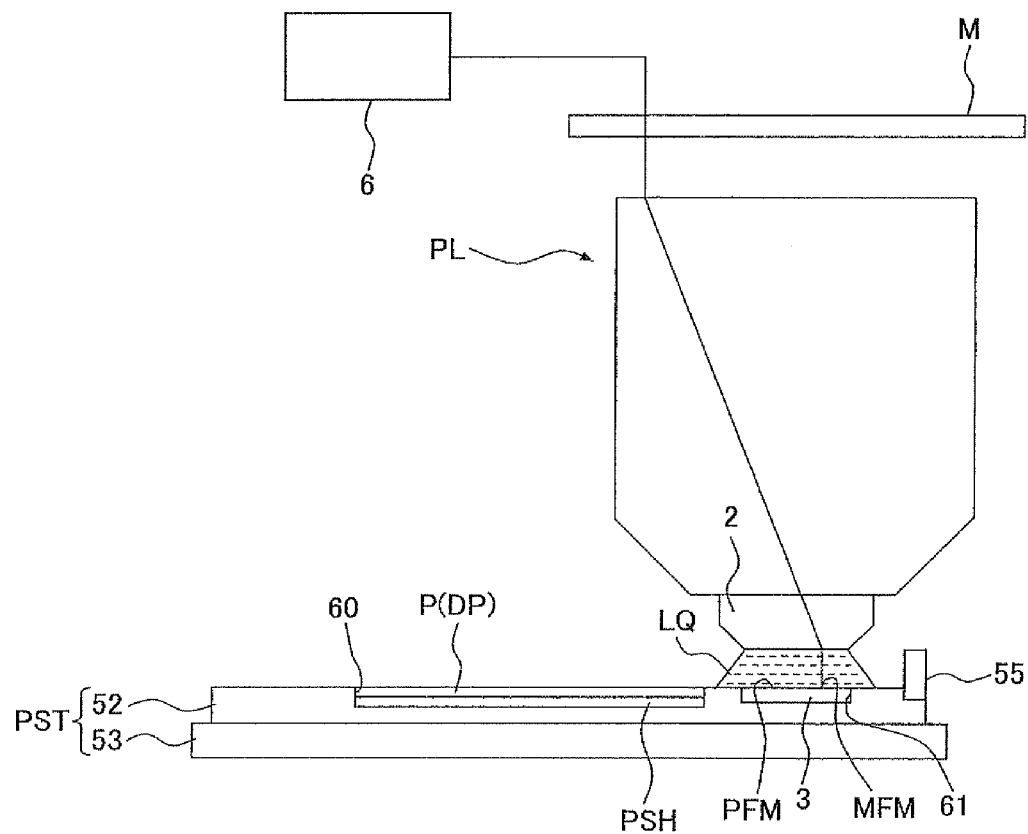
FIG. 8 schematically shows another embodiment of the substrate stage according to the present invention.

FIGS. 7 and 8 schematically show another embodiment of the present invention. FIG. 7 shows a state in which the projection optical system PL is arranged over the substrate P, and FIG. 8 shows a state in which the projection optical system PL is arranged over the reference member 3. With reference to FIGS. 7 and 8, a recess 60 is formed on the Z stage 52 in order to arrange the substrate P on the substrate holder PSH, and a recess 61 is formed on the Z stage 52 in order to arrange the reference member 3. The upper surface of the substrate P arranged in the recess 60, the upper surface of the reference member 3 arranged in the recess 61, and the upper surface of the Z stage 52 are provided so that they are substantially flush with one another. Accordingly, even when the switching is effected from the state shown in FIG. 7 to the state shown in FIG. 8 in order to detect the reference mark MFM on the reference member 3 through the liquid LQ, the substrate stage PST can be moved in the XY directions in a state in which the liquid LQ is retained on the image plane side of the projection optical system PL. Of course, even when the switching is effected from the state shown in FIG. 8 to the state shown in FIG. 7, the substrate stage PST can be moved in the XY directions in a state in which the liquid LQ is retained on the image plane side of the projection optical system PL. When the reference mark MFM on the reference member 3 is detected through the liquid LQ, it is considered that the following situation may arise depending on the size of the liquid immersion area of the liquid LQ formed on the reference member 3. That is, a part (end) of the liquid immersion area on the reference member 3 may be arranged in the recess 60 in which the substrate holder PSH is arranged, during the operation for detecting the reference mark MFM. However, when the substrate P is arranged in the substrate holder PSH of the recess 60, it is possible to avoid the inflow of the liquid LQ into the recess 60. The recess 60 can be made flat by arranging the substrate P. It is possible to avoid any disturbance of the liquid immersion area which would be otherwise caused by the recess (difference in level or any stepped portion). In addition to the arrangement in which the reference member 3 formed with the reference mark is embedded in the recess 61 of the Z stage 52, it is also allowable that the reference mark is formed directly on the upper surface of the Z stage 52 without providing the recess 61.

The embodiment described above adopts such a sequence that the alignment marks 1 on the substrate P are detected, and then the reference mark MFM is detected by the mask alignment system 6. Therefore, the substrate P for producing the device is arranged on the substrate holder PSH during the operation for detecting the reference mark MFM by the mask alignment system 6 through the liquid LQ. However, the following possibility arises. That is, the baseline amount may be measured singly in some cases. In other cases, a sequence may be adopted, in which the substrate P is loaded on the substrate holder PSH after the measurement of the baseline amount. In such a situation, it is of course possible to arrange a dummy substrate DP in the substrate holder PSH. In this arrangement, the dummy substrate DP has approximately the same shape and the same size as those of the substrate P for producing the device. The dummy substrate DP may be formed of the same material as that of the substrate P, for example, silicon. However, various types of materials can be used for the dummy substrate DP provided that there is no elution of pollution matters or the like brought about by the contact with the liquid LQ. In this case, the reference mark MFM is detected via the projection optical system PL and the liquid LQ by the mask alignment system 6 in a state in which the dummy substrate DP is arranged on the substrate holder PSH. Subsequently, the reference mark PFM is detected without any liquid LQ by the substrate alignment system 5 to measure the baseline amount. Before or after the operation of the detection by the substrate alignment system 5, the dummy substrate DP is unloaded from the substrate holder PSH, and the substrate P for producing the device is loaded on the substrate holder PSH. The alignment marks 1 on the substrate P are detected by the substrate alignment system 5, and then the positional adjustment is performed for the image of the pattern and the shot areas on the substrate P on the basis of the baseline amount and the position information about the alignment marks 1 on the substrate P to perform the liquid immersion exposure.

Figure 9:
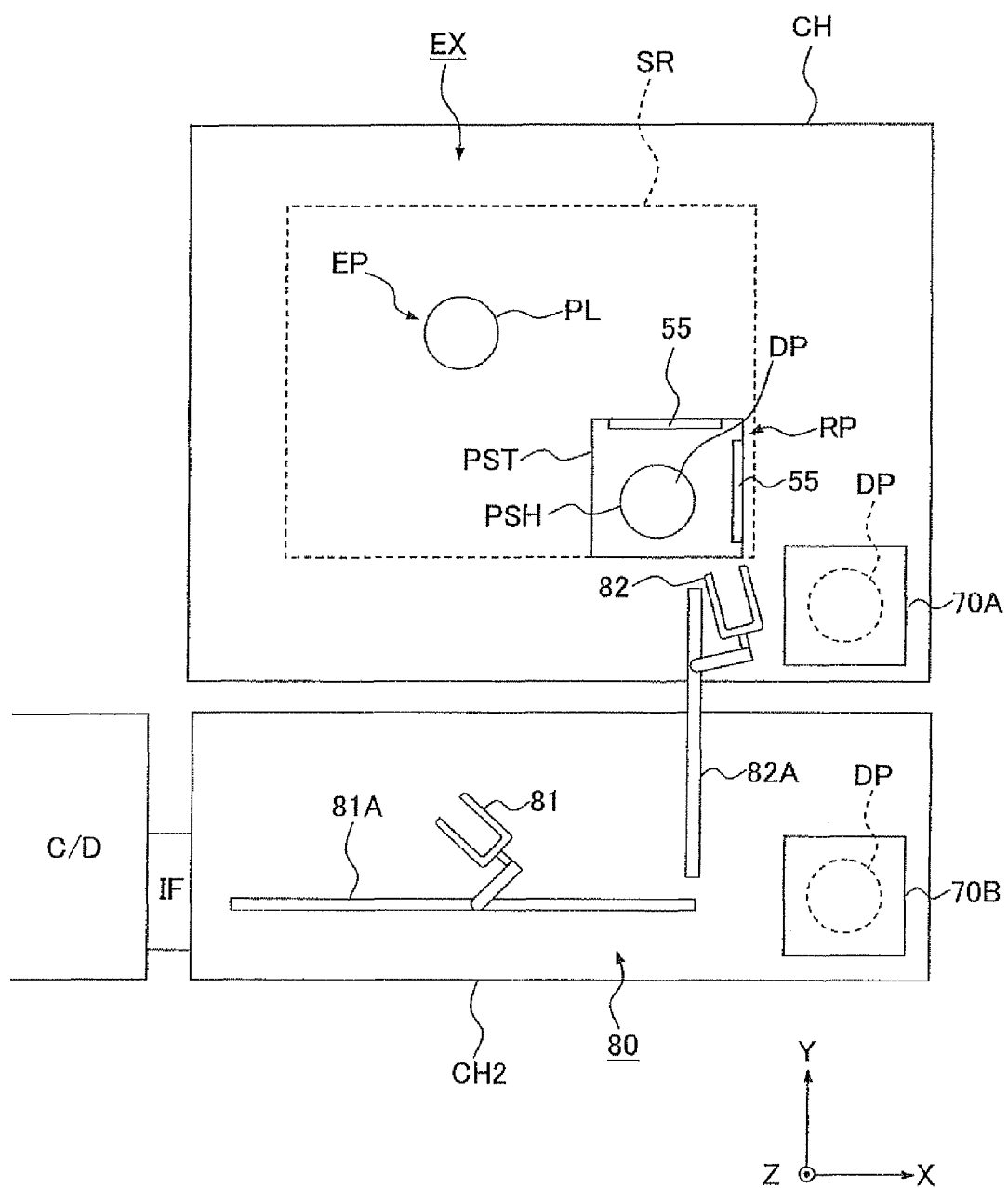
FIG. 9 shows a plan view illustrating an embodiment of an exposure apparatus provided with a waiting place for a dummy substrate.

FIG. 9 shows a plan view schematically illustrating an example of an exposure apparatus EX provided with a dummy substrate library 70A for storing the dummy substrate DP. With reference to FIG. 9, the exposure apparatus EX is provided in a chamber apparatus CH. The interior of the chamber apparatus CH is maintained to be in a predetermined environment (temperature, humidity) by an air conditioning system. The substrate stage PST is provided movably in a predetermined movable range in the chamber apparatus CH. A transport unit 80, which transports the substrate P, is connected to the exposure apparatus EX. A coater/developer C/D, which has a function to coat the substrate P with a photosensitive material and a function to develop the substrate P having been subjected to the exposure process, is connected via an interface section IF to the transport unit 80. The transport unit 80 is provided with a first arm section 81 and a second arm section 82 for holding and transporting the substrate P. The first and second arm sections 81, 82 are moved while being guided by guide sections 81A, 82A respectively. The first and second arm sections 81, 82 and the guide sections 81A, 82A are provided in a second chamber apparatus CH2. The substrate P before undergoing the exposure process, which is coated with the photosensitive material by the coater/developer C/D, is transported into the chamber apparatus CH of the exposure apparatus EX by the first arm section 81 and the second arm section 82. When the substrate P before undergoing the exposure process is loaded by the second arm section 82, the substrate stage PST is moved to the substrate exchange position RP. The substrate stage PST, on which the substrate P has been loaded at the substrate exchange position RP, is moved to the exposure process position EP disposed under the projection optical system PL. The substrate stage PST, which holds the substrate P after the completion of the exposure process, is moved to the substrate exchange position RP. The substrate P, for which the exposure process has been completed, is unloaded by the second arm section 82 (or another arm section) at the substrate exchange position RP. The substrate P is transported by the first arm section 81 (or another arm section) via the interface section IF to the coater/developer C/D.

When the dummy substrate DP is arranged on the substrate holder PSH, the control unit CONT takes out the dummy substrate DP from the dummy substrate library 70A which is the waiting place for the dummy substrate DP provided in the chamber apparatus CH, by using, for example, the second arm section 82. The dummy substrate DP is loaded on the substrate holder PSH of the substrate stage PST at the substrate exchange position RP. The control unit CONT detects the reference mark MFM, for example, via the projection optical system PL and the liquid LQ by the mask alignment system 6 as described above, in a state in which the dummy substrate DP is held by the substrate holder PSH.

When the dummy substrate DP is unloaded from the substrate stage PST after the completion of the detection process performed through the liquid LQ as described above, the control unit CONT firstly performs the operation for removing the liquid LQ adhering and remaining on the dummy substrate DP, for example, by using the liquid recovery mechanism 20. The substrate stage PST, which holds the dummy substrate DP having been subjected to the liquid-removing process, is moved by the control unit CONT to the substrate exchange position RP. The control unit CONT unloads the dummy substrate DP from the substrate stage PST by using the second arm section 82 (or another arm section). The dummy substrate DP is accommodated in the dummy substrate library 70A which is the waiting place for the dummy substrate DP.

In this embodiment, the dummy substrate library 70A is provided in the chamber apparatus CH for accommodating the exposure apparatus EX. However, as indicated by the symbol 70B in FIG. 9, the dummy substrate library may be provided, for example, in the second chamber apparatus CH2 for accommodating the transport unit 80. Alternatively, the dummy substrate library may be arranged in the coater/developer C/D.

It is preferable that the dummy substrate DP has the liquid repellence. In this embodiment, the dummy substrate DP is subjected to the liquid-repelling treatment to have the liquid repellence. The liquid-repelling treatment includes, for example, a coating treatment using a material having the liquid repellence. The material having the liquid repellence includes, for example, fluorine-based compounds, silicon compounds, and synthetic resins such as acrylic resins and polyethylene. The thin film, which is adopted for the surface treatment, may be either a single layer film or a film formed of a plurality of layers.

The liquid repellence of the dummy substrate DP is deteriorated in a time-dependent manner. Accordingly, the dummy substrate DP may be exchanged depending on the deterioration of the liquid repellence. Alternatively, the dummy substrate DP may be formed of a liquid-repellent material (for example, fluorine-based material or acrylic).

Figure 10A:
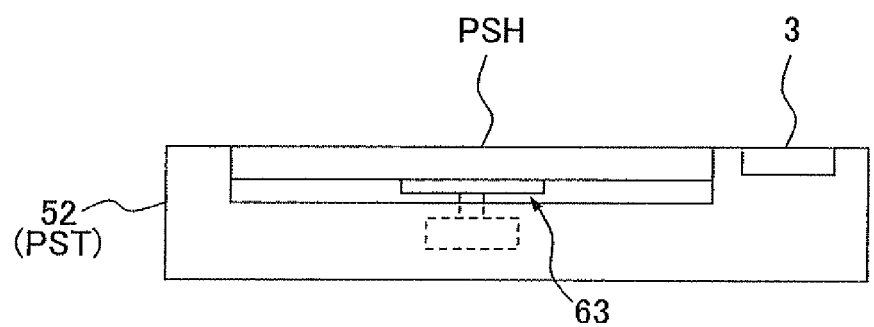
FIGS. 10A and 10B schematically show another embodiment of a substrate stage according to the present invention.
Figure 10B:
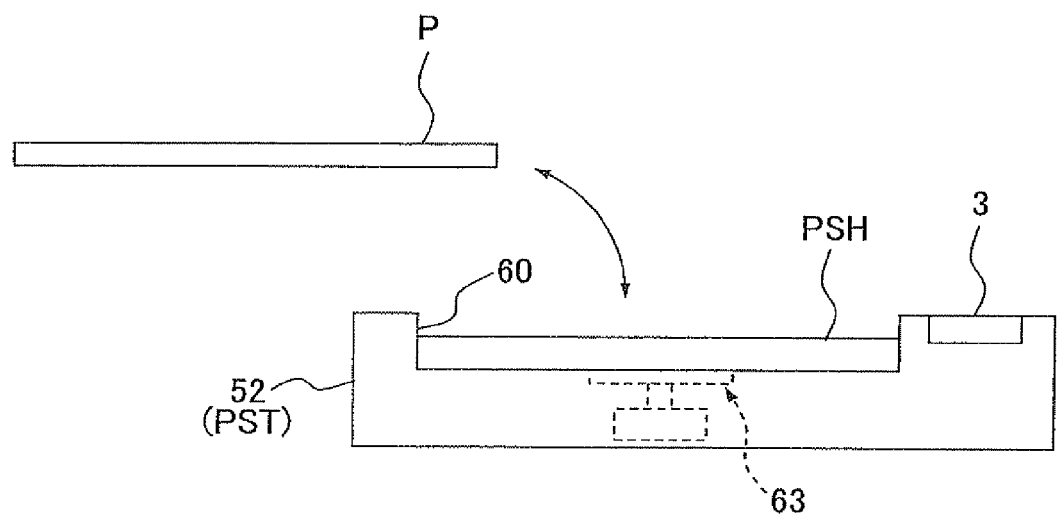

FIG. 10 schematically shows another embodiment. As shown in FIG. 10, the following arrangement may also be adopted. That is, a recess 60 is formed on the Z stage 52 (substrate stage PST). A substrate holder PSH, which has a shape corresponding to the recess 60, is arranged in the recess 60, and a lifting unit 63, which moves the substrate holder PSH upwardly and downwardly, is provided in the Z stage 52. As shown in FIG. 10A, the lifting unit 63 moves the substrate holder PSH upwardly so that the upper surface of the Z stage 52 is flush with the upper surface of the substrate holder PSH during the operation for detecting the reference mark MFM through the liquid LQ by the mask alignment system 6. Accordingly, it is also possible to avoid the occurrence of the inconvenience which would be otherwise caused, for example, such that the liquid LQ of the liquid immersion area, which is formed on the reference member 3 in order to measure the reference mark MFM through the liquid LQ, inflows into the Z stage (substrate stage PST). As shown in FIG. 10B, the recess 60 is provided in order that the substrate P is arranged by moving the substrate holder PSH downwardly by the lifting unit 63, when the substrate P for producing the device is held by the substrate holder PSH in order to perform the liquid immersion exposure. When the liquid LQ is adhered to the surface of the substrate holder PSH when the substrate P is placed, the substrate P may be placed after removing or recovering the adhered liquid LQ.

In the embodiment described above, the interior of the Z stage 52 is prevented from any inflow of the liquid LQ by holding the substrate P or the dummy substrate DP by the substrate holder PSH when the reference mark MFM on the substrate stage PST is detected via the projection optical system PL and the liquid LQ. However, this prevention of the inflow is not limited to the time of the detection of the reference mark MFM. It is desirable that the inflow of the liquid LQ into the Z stage 52 (substrate stage PST) is avoided by holding the substrate P or the dummy substrate DP on the substrate holder PSH, or by using the arrangement as shown in FIG. 10, when the liquid immersion area AR2 is formed at the circumferential portion of the upper surface of the Z stage 52 (substrate stage PST), for example, when various types of measuring sensors disposed on the Z stage 52 (substrate stage PST) are used.

As described above, the operation for detecting the reference marks PFM, MFM to determine the baseline amount may be performed at every predetermined period of time, for example, every time when a preset number of the substrates are processed or every time when the mask M is exchanged. In the embodiment described above, the dummy substrate DP is held by the substrate holder PSH, for example, when the baseline amount is measured singly before the substrate P is loaded on the substrate holder PSH. Accordingly, the interior of the substrate holder PSH and the interior of the substrate stage PST are prevented from any inflow of the liquid LQ. On the other hand, when the baseline amount is measured, the operation for detecting the reference marks PFM, MFM may be performed in order to determine the baseline amount in a state in which the substrate P having been already subjected to the exposure process is held on the substrate holder PSH, in place of the state in which the dummy substrate DP is held on the substrate holder PSH. Also in this way, the interior of the substrate holder PSH and the interior of the substrate stage PST can be prevented from any inflow of the liquid LQ. The substrate P having been already subjected to the exposure process may be unloaded after the completion of the measurement of the baseline amount. That is, after the completion of the exposure for the substrate P, the position information about the reference mark PFM on the substrate stage PST is detected by the substrate alignment system 5, and the position information about the reference mark MFM on the substrate stage PST is detected by the mask alignment system 6 in the state in which the substrate P having been already subjected to the exposure process is held by the substrate stage PST. The baseline amount is determined on the basis of the detection results of the position information about the reference marks PFM, MFM, and then the substrate P having been already subjected to the exposure process is exported from the substrate stage PST. Accordingly, the interior of the substrate holder PSH and the interior of the substrate stage PST can be prevented from any inflow of the liquid LQ.

A procedure is also conceived, in which the operation for detecting the reference marks PFM, MFM is performed in order to determine the baseline amount in a state in which the substrate P before being subjected to the exposure process is held on the substrate holder PSH. However, for example, when the reference mark MFM is detected through the liquid LQ, there is such a high possibility that the liquid LQ may adhere to the alignment mark 1 on the substrate P before being subjected to the exposure process. The substrate alignment system 5, which detects the alignment marks on the substrate P, is constructed to perform the detection not through the liquid LQ (in the dry state). Therefore, the detection accuracy is consequently deteriorated if the liquid LQ adheres to the alignment mark 1 when the alignment mark 1 on the substrate P before being subjected to the exposure process is detected by the substrate alignment system 5. Therefore, it is preferable that the substrate P, which is to be held by the substrate holder PSH when the reference marks PFM, MFM are detected in order to determine the baseline amount, is the substrate P after being subjected to the exposure process.

It is desirable that the interior of the Z stage (substrate stage PST) is prevented from any inflow of the liquid LQ by holding the substrate P or the dummy substrate DP on the substrate holder PSH or by using the mechanism shown in FIG. 10 when the liquid immersion area AR2 is formed on the Z stage (substrate stage PST) even when the reference member and the measuring member such as various types of measuring sensors are not arranged on the Z stage 52 (substrate stage PST).

More specifically, it is desirable that the formation of the liquid immersion area AR2 on the Z stage 52 (substrate stage PST) is prohibited when the recess 60 of the Z stage 52 (substrate stage PST) is not covered with the substrate P or the dummy substrate DP irrelevant to the presence or absence of the reference member and the measuring member such as various types of measuring sensors on the Z stage 52 (substrate stage PST).

The control unit CONT can prohibit the liquid supply by the liquid supply mechanism 10 and restrict the movement range of the Z stage 52 (substrate stage PST) in the XY plane so that the optical element 2 of the projection optical system PL is not opposed to the Z stage 52 (substrate stage PST), for example, when the recess 60 of the Z stage 52 (substrate stage PST) is not covered with the substrate P or the dummy substrate DP.

The control unit CONT integrally controls the operation of the entire exposure apparatus EX. Therefore, the control unit CONT can judge whether or not the recess 60 of the Z stage 52 (substrate stage PST) is covered with, for example, the substrate P or the dummy substrate DP. However, it is also possible to use a detector for detecting whether or not the recess 60 is covered with the substrate P or the dummy substrate DP as described later on.

It is desirable to provide the state in which the liquid LQ is not disposed on (not adhered to) the alignment mark 1 on the substrate P as described above when the alignment mark 1 on the substrate P is detected by the substrate alignment system 5. It is feared that the liquid LQ, which remains and adheres to the supply nozzle 13, the recovery nozzle 23, or the optical element 2, may be dripped or scattered onto the substrate P when the substrate P before being subjected to the exposure process, which is loaded on the substrate stage PST, passes across the position under the supply nozzle 13, the position under the recovery nozzle 23, or the position under the optical element 2 of the projection optical system PL. If the dripped liquid LQ is disposed on (adhered to) the alignment mark 1 on the substrate P, then the substrate alignment system 5 cannot measure the alignment mark 1, and any measurement error is generated. Even when the measurement can be performed, then the image of the alignment mark 1 and the waveform signal are distorted, and the measurement is performed erroneously. As a result, any inconvenience arises, for example, such that the alignment measurement accuracy is deteriorated.

Further, a procedure is also conceived, in which the liquid immersion area AR2 is formed at another position on the substrate stage PST (for example, on the auxiliary plate 57 or on the upper surface of the Z stage 52) separately from the substrate P held by the substrate stage PST, while the substrate alignment system 5 measures the alignment mark 1 on the substrate P not through the liquid LQ. Furthermore, a procedure is also conceived, in which the liquid immersion area AR2 is formed (locally) on a part of the substrate P, while the alignment mark 1 is detected, outside the liquid immersion area AR2, by the substrate alignment system 5 not through the liquid LQ. Also in this case, if the liquid LQ is scattered from the liquid immersion area AR2, and/or the liquid LQ is not recovered sufficiently, then an inconvenience arises such that the alignment mark 1 is measured by the substrate alignment system 5 in a state in which the liquid LQ is arranged on the alignment mark 1 on the substrate P.

Accordingly, the control unit CONT determines the movement locus of the substrate stage PST so that the alignment mark 1 on the substrate P, which is to be arranged in the detection area for the substrate alignment system 5, does not pass across the position under the supply nozzle 13, the recovery nozzle 23, or the optical element 2 of the projection optical system PL. The control unit CONT successively measures the plurality of alignment marks 1 on the substrate P respectively by using the substrate alignment system 5 while moving the substrate stage PST on the basis of the determined movement locus.

Figure 11A:
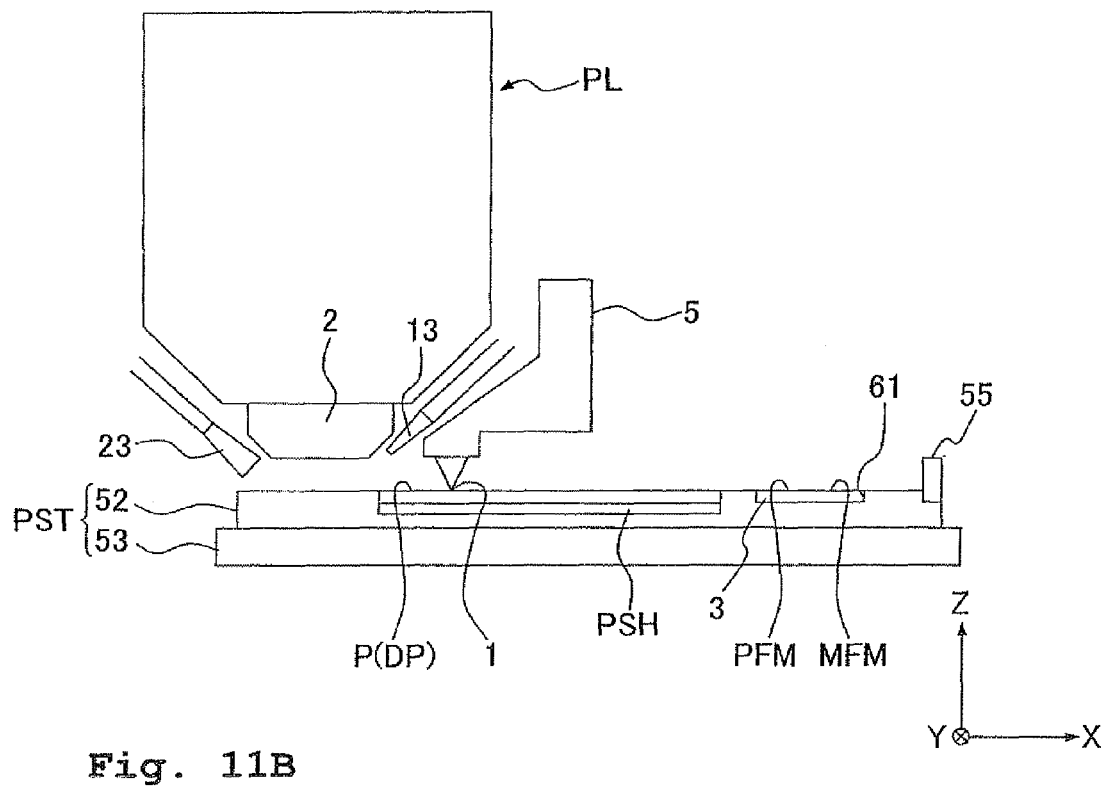
FIGS. 11A and 11B illustrate the movement locus of the substrate stage according to the present invention.

FIG. 11 explains the operation for successively measuring the plurality of alignment marks 1 on the substrate P respectively by the substrate alignment system 5. With reference to FIG. 11, the supply nozzles 13 and the recovery nozzles 23 are arranged in the vicinity of the optical element 2 of the projection optical system PL. The substrate alignment system 5 is arranged on the +X side of the optical element 2, the supply nozzles 13, and the recovery nozzles 23. When the plurality of alignment marks 1 on the substrate P are successively measured respectively by using the substrate alignment system 5 in the positional relationship as described above, the control unit CONT firstly arranges the alignment mark 1 accompanied with the shot area provided on the most −X side on the substrate P in the detection area of the substrate alignment system 5 as shown in FIG. 11A to measure the alignment mark 1 by the substrate alignment system 5. For example, the control unit CONT arranges the alignment mark 1 accompanied, for example, with the shot area S10 or S11 on the substrate P (see FIG. 4) in the detection area of the substrate alignment system 5. In the following description, the alignment mark 1, which is firstly measured, is referred to as "first alignment mark".

On this assumption, when the first alignment mark 1 on the substrate P is arranged in the detection area of the substrate alignment system 5 after the substrate P before being subjected to the exposure process is loaded on the substrate stage PST at the substrate exchange position RP (see FIG. 9), the control unit CONT moves the substrate stage PST so that at least the alignment mark 1, which is the measurement objective for the substrate alignment system 5 and which is included in the plurality of alignment marks 1 on the substrate P, does not pass across the positions under the supply nozzles 13, the recovery nozzles 23, and the optical element 2. Accordingly, the first alignment mark 1 is arranged in the detection area of the substrate alignment system 5 without passing across, for example, the positions under the supply nozzles 13. Therefore, it is possible to avoid the inconvenience which would be otherwise caused such that the first alignment mark 1 is measured by the substrate alignment system 5 in a state in which the liquid LQ dripped, for example, from the supply nozzle 13, is disposed onto the first alignment mark 1.

After the completion of the detection of the first alignment mark 1, the control unit CONT moves the substrate stage PST toward the −X side so that a second alignment mark 1 (for example, the alignment mark 1 accompanied by the shot area S12 or S9), which is provided on the +X side as compared with the first alignment mark 1, is arranged in the detection area of the substrate alignment system 5. In this procedure, the control unit CONT determines the movement locus of the substrate stage PST so that the alignment mark 1 as the measurement objective does not pass across the position under the supply nozzle 13 or the like to arrive at the detection area of the substrate alignment system 5. Therefore, after the substrate P is loaded on the substrate stage PST, the second alignment mark 1 does not pass across the position under the supply nozzle 13 or the like during the period until the second alignment mark 1 on the substrate P is arranged in the detection area of the substrate alignment system 5. Therefore, the inconvenience is avoided, which would be otherwise caused such that the liquid LQ dripped from the supply nozzle 13 or the like is arranged on the second alignment mark 1. It is allowable that the first alignment mark 1, which has been already measured by the substrate alignment system 5, passes across the position under the supply nozzle 13 or the like.

Figure 11B:
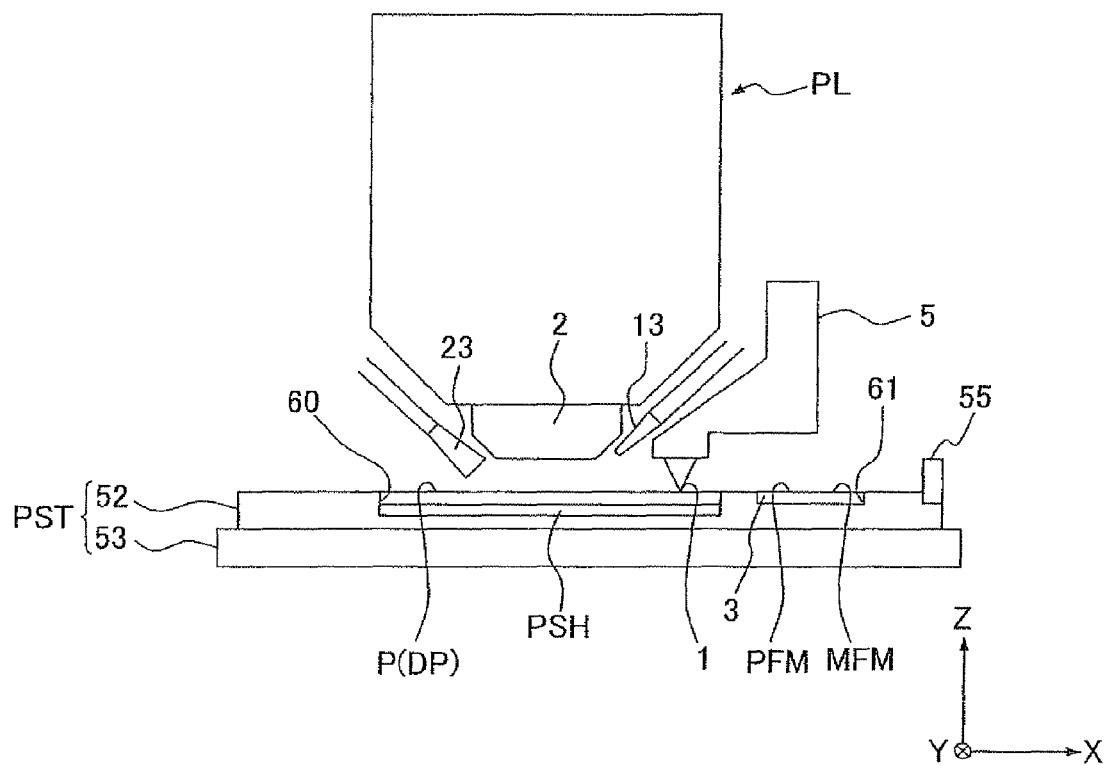

The operation is similarly performed thereafter as shown in FIG. 11B. That is, third and fourth alignment marks 1, which are provided on the +X side as compared with the second alignment mark 1, are successively arranged in the detection area of the substrate alignment system 5 by the control unit CONT to perform the measurement. The operation as described above is performed by the control unit CONT by controlling the substrate stage-driving unit PSTN on the basis of the exposure recipe while monitoring the position of the substrate stage PST with the laser interferometer 56.

In this procedure, the control unit CONT moves the substrate stage PST toward the −X side to successively arrange the alignment marks 1 in the order from the alignment mark 1 on the −X side to the alignment mark 1 on the +X side in the detection area of the substrate alignment system 5. However, when the substrate alignment system 5 is provided on the −X side of the projection optical system PL, the substrate stage PST is moved toward the +X side. The order of the detection of the alignment marks 1 is not limited to the order along with the X axis direction. As described above, it is unnecessary that all of the plurality of alignment marks 1 provided on the substrate P are detected by the substrate alignment system 5. Therefore, any alignment mark 1, which is not the measurement objective for the substrate alignment system 5, is permitted to pass across the position under the supply nozzle 13 or the like. In principle, it is enough that the alignment mark 1, which is the measurement objective before being arranged in the detection area of the substrate alignment system 5, does not pass across the position under the supply nozzle 13 or the like.

As explained above, the movement locus of the substrate stage PST, which is to be set in order to arrange the alignment mark 1 in the detection area of the substrate alignment system 5, is determined by the control unit CONT depending on the positional relationship between the substrate alignment system 5 and the supply nozzles 13 (as well as the recovery nozzles 23 and the optical element 2). Accordingly, it is possible to avoid the inconvenience of the adhesion of the liquid LQ which would be otherwise caused by the passage of the alignment mark 1 to be measured by the substrate alignment system 5 across the position under the supply nozzle 13 or the like. Therefore, it is possible to avoid the inconvenience which would be otherwise caused such that the substrate alignment system 5 measures the alignment mark 1 in the state the liquid LQ is adhered thereto. Thus, it is possible to avoid the measurement error and the erroneous measurement. Therefore, the rate of operation of the exposure apparatus EX is improved, and the exposure accuracy can be maintained in a highly sophisticated manner.

In the case of the embodiment explained with reference to FIG. 11, the alignment marks 1 may be detected by the substrate alignment system 5 in a state in which the liquid LQ is retained on the image plane side of the projection optical system PL. In this procedure, the liquid immersion area AR2 is formed on the upper surface of the substrate stage PST (Z stage 52), on the portion ranging over the upper surface of the substrate stage PST and the surface of the substrate P, or on the surface of the substrate P. However, as also clarified from FIG. 11, the control unit CONT determines the movement locus of the substrate stage PST so that the alignment mark 1 of the substrate P is detected by the substrate alignment system 5 before the alignment mark 1 makes contact with the liquid LQ in the liquid immersion area AR2 (see FIG. 1). Therefore, it is possible to avoid the inconvenience which would be otherwise caused such that the substrate alignment system 5 measures the alignment mark 1 in a state in which the liquid LQ is adhered to the alignment mark 1.

In this embodiment, the alignment mark 1 on the substrate P does not pass across the position under the supply nozzle 13 or the like before being arranged in the detection area of the substrate alignment system 5. However, it is also allowable that the movement locus of the substrate stage PST is determined so that the reference mark PFM before being arranged in the detection area of the substrate alignment system 5 does not pass across the position under the supply nozzle 13 or the like. The movement locus of the substrate stage PST is determined so that not only the alignment marks 1 and the reference mark PFM but also any mark (measurement objective) on the substrate stage PST to be measured in the dry state does not pass across the position under the member from which the liquid LQ can be dripped. Accordingly, it is possible to improve the mark measurement accuracy not through the liquid LQ.

The embodiment described above is illustrative of the movement locus adopted when the substrate stage PST is moved from the substrate exchange position RP to the position in the vicinity of the projection optical system PL (exposure process position EP) and/or when the plurality of alignment marks 1 on the substrate P are measured. However, it is preferable that the movement locus of the substrate stage PST is determined so that the alignment mark 1 on the substrate P does not pass across the position under the supply nozzle 13 or the like as well, for example, when the alignment mark 1 on the substrate P is measured after measuring the reference marks PFM, MFM on the reference member 3. For example, with reference to FIG. 12, when the reference mark MFM on the reference member 3 is measured through the liquid LQ by using the mask alignment system 6, the control unit CONT measures the reference mark MFM in a state in which the liquid immersion area AR2 is formed on the reference member 3. After the measurement of the reference mark MFM through the liquid LQ is completed, the control unit CONT recovers the liquid LQ from the surface of the reference member 3 by using, for example, the liquid recovery mechanism 20. When the alignment mark 1 on the substrate P is arranged in the detection area of the substrate alignment system 5 thereafter, the control unit CONT moves the XY stage 53 while monitoring the output of the laser interferometer 56 so that the supply nozzle 13 or the like is advanced along the broken line arrow K shown in FIG. 12. The control unit CONT arranges the first alignment mark 1 (for example, the alignment mark 1 accompanied with the shot area S10) in the detection area of the substrate alignment system 5. Also in this case, the alignment mark 1 before being measured by the substrate alignment system 5 does not pass across the position under the supply nozzle 13 or the like. Therefore, the liquid LQ, which is dripped from the supply nozzle 13 or the like, is not adhered thereto.

When any detection error arises due to the adhesion of the liquid to the alignment mark 1, the following operation may be performed in the same manner as in the case in which any detection error arises due to the adhesion of any foreign matter to the alignment mark 1. That is, the detection of the concerning alignment mark may be stopped, and another alignment mark disposed in the vicinity thereof may be detected in place of the concerning alignment mark. Alternatively, the substrate P itself may be handled as a defective substrate.

The mark image and the signal waveform, which are obtained when the alignment mark on the substrate P is detected in the dry state by the substrate alignment system 5, may be previously stored. When the mark image and/or the signal waveform, which is obtained when the alignment mark 1 is actually detected by the substrate alignment system 5, is greatly different from the stored data, then it is judged that the liquid adheres to at least one of the alignment mark and the optical element disposed at the terminal end of the substrate alignment system 5, and the detection error is outputted to urge the operator or the like to wipe out the adhered liquid.

Similarly, the mark image and the signal waveform, which are obtained when the reference mark PFM is measured in the dry state by the substrate alignment system 5, may be stored beforehand. When the mark image and/or the signal waveform, which is actually obtained for the reference mark PFM by the substrate alignment system 5, for example, upon the measurement of the baseline amount, is greatly different from the stored data, then it is judged that the liquid adheres to at least one of the reference mark PFM and the optical element disposed at the terminal end of the substrate alignment system 5, and the detection error is outputted to urge the operator or the like to wipe out the adhered liquid.

The mark image and the signal waveform to be stored may be obtained by the substrate alignment system 5 in the exposure apparatus EX. Alternatively, the mark image and the signal waveform to be stored may be obtained outside the exposure apparatus EX.

Figure 12:
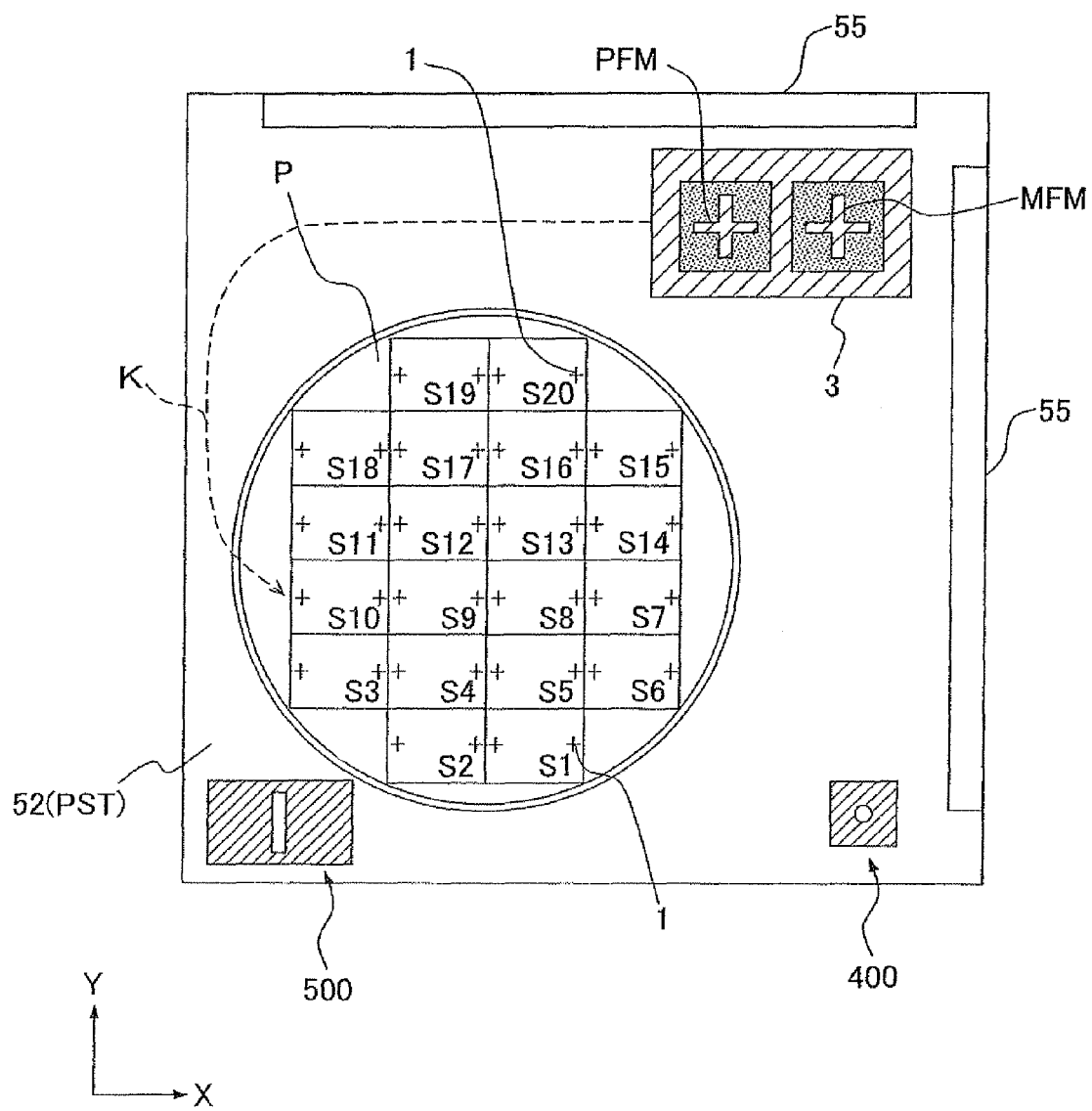
FIG. 12 illustrates the movement locus of the substrate stage according to the present invention.

An uneven illuminance sensor 400 as disclosed, for example, in Japanese Patent Application Laid-open No. 57-117238 and a spatial image-measuring sensor 500 as disclosed, for example, in Japanese Patent Application Laid-open No. 2002-14005 are provided on the substrate stage PST shown in FIG. 12. It is assumed that the measurement process is performed through the liquid LQ in a state in which the liquid immersion area AR2 is formed on each of the measuring sensors 400, 500. Also in this case, the control unit CONT performs the liquid recovery by using, for example, the liquid recovery mechanism 20 after the completion of the measurement process by the sensors 400, 500. When the alignment mark 1 on the substrate P is arranged in the detection area of the substrate alignment system 5, the control unit CONT determines the movement locus of the substrate stage PST so that the alignment mark 1 on the substrate P as the measurement objective for the substrate alignment system 5 does pass across the position under the supply nozzle 13 or the like.

Figure 13A:
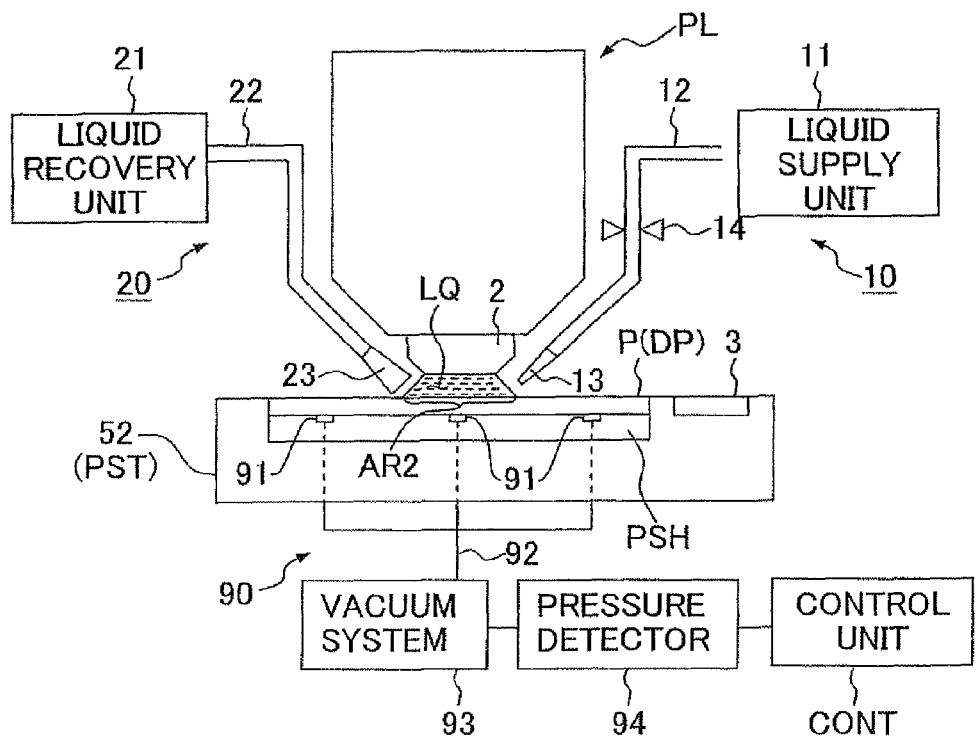
FIGS. 13A and 13B illustrate the operation of the liquid supply mechanism according to the present invention.

FIG. 13 schematically shows another embodiment of the present invention. With reference to FIG. 13A, the exposure apparatus EX includes an attracting and holding mechanism 90 which attracts and holds the substrate P on the substrate holder PSH. The attracting and holding mechanism 90 includes suction holes 91 which are provided at a plurality of positions on the upper surface of the substrate holder PSH respectively, and a vacuum system 93 which is connected via a flow passage 92 to each of the plurality of suction holes 91. The control unit CONT drives the vacuum system 93, and thus the back surface of the substrate P placed on the upper surface of the substrate holder PSH is held by vacuum suction by the aid of the suction holes 91.

The information, which relates to the pressure of the vacuum system 93 or the flow passage 92 of the attracting and holding mechanism 90, is monitored by the pressure detector 94. The pressure detector 94 is capable of detecting whether or not the substrate P (or the dummy substrate DP) is held on the substrate holder PSH on the basis of the information about the detected pressure. That is, the pressure detector 94 judges that the substrate P is not held on the substrate holder PSH when the suction operation is executed by the attracting and holding mechanism 90 and the pressure is not lowered. The pressure detector 94 judges that the substrate P is held on the substrate holder PSH when the pressure is lowered. The detection result and the judgment result of the pressure detector 94 are outputted to the control unit CONT.

A valve 14, which opens/closes the flow passage of the supply tube 12, is provided at an intermediate position of the supply tube 12 of the liquid supply mechanism 10. The operation of the valve 14 is controlled by the control unit CONT.

When the substrate P is held on the substrate holder PSH as shown in FIG. 13A, the pressure detector 94 can detect that the substrate P is held on the substrate holder PSH on the basis of the information about the pressure as described above. When the pressure detector 94 detects the substrate P, the control unit CONT issues the instruction to enable the liquid supply to the liquid supply mechanism 10 on the basis of the detection result (judgment result) of the pressure detector 94.

Figure 13B:
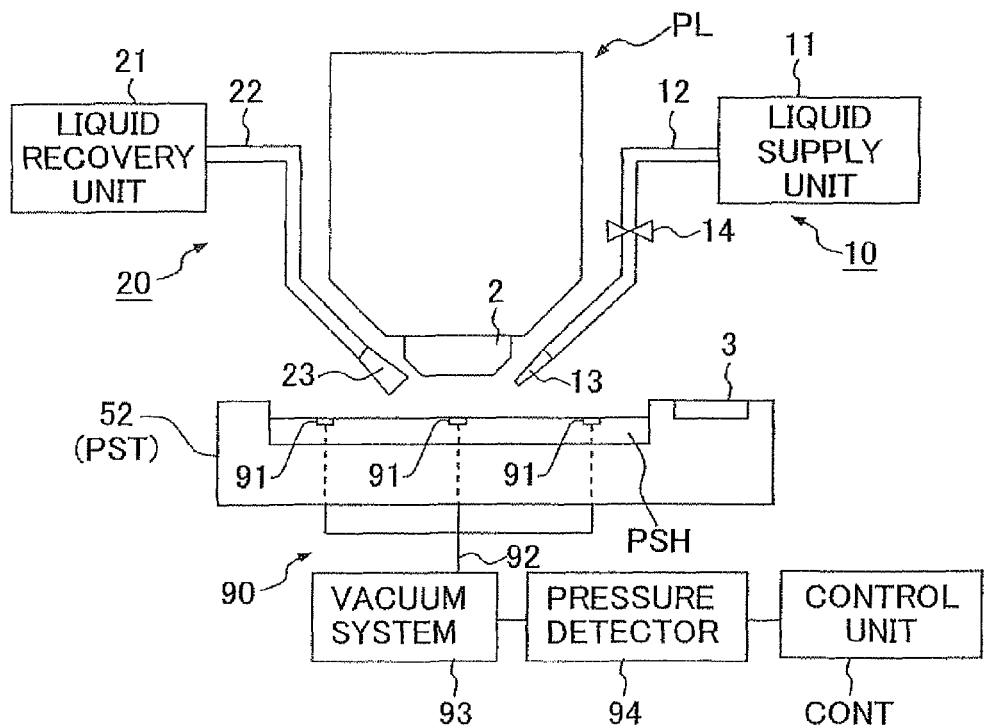

On the other hand, as shown in FIG. 13B, when the substrate P is not held on the substrate holder PSH, the pressure detector 94 can detect that the substrate P is not held on the substrate holder PSH on the basis of the information about the pressure. When the pressure detector 94 does not detect the substrate P, the control unit CONT issues the instruction to disable the liquid supply to the liquid supply mechanism 10 on the basis of the detection result (judgment result) of the pressure detector 94. The liquid supply mechanism 10, which has received the instruction of the control unit CONT, closes the flow passage of the supply tube 12, for example, by the valve 14. Accordingly, the control unit CONT stops the liquid supply by the liquid supply mechanism 10.

When the liquid immersion area AR2 is formed and/or the liquid supply is executed by the liquid supply mechanism 10 in the state in which the substrate P or the dummy substrate DP is not held on the substrate holder PSH as described above, there is such a possibility that the liquid LQ inflows into the substrate holder PSH and into the substrate stage PST. For example, if the liquid LQ inflows into the substrate stage PST, then any rust appears, and any inconvenience arises in the sliding portions and the electric equipment arranged therein. An extremely long period of time is required for the restoration. On the other hand, if the holding surface of the substrate holder PSH catches the liquid LQ, an inconvenience arises such that the liquid LQ flows into the vacuum system 93 via the suction hole 91. If the liquid LQ adheres to the holding surface of the substrate holder PSH, the following inconvenience occurs as well. That is, the liquid LQ functions as a lubricating film when the substrate P is placed, and the substrate P is held in a deviated state with respect to the desired position. Accordingly, as in the embodiment of the present invention, the operation of the liquid supply mechanism 10 is controlled depending on whether or not the substrate P or the dummy substrate DP is held on the substrate holder PSH. Accordingly, it is possible to avoid the adhesion of the liquid LQ to the holding surface of the substrate holder PSH and the inflow of the liquid into the substrate stage PST. When the substrate P or the dummy substrate DP is not held on the substrate holder PSH, the control unit CONT stops the liquid supply by the liquid supply mechanism 10. Accordingly, it is possible to avoid, for example, the inflow of the liquid into the substrate stage PST.

In this embodiment, it is judged whether or not the substrate P and/or the dummy substrate DP is held on the substrate holder PSH on the basis of the detection result of the pressure detector 94. However, for example, a contact type sensor for detecting the presence or absence of the substrate may be provided for the substrate stage PST and/or the substrate holder PSH, and the operation of the liquid supply mechanism 10 may be controlled on the basis of an obtained detection result. Alternatively, the focus-detecting system 4 as described above may be used to judge whether or not the substrate P or the dummy substrate DP is held on the substrate holder PSH, and the operation of the liquid supply mechanism 10 may be controlled on the basis of an obtained result. Further, the Z stage 52 (substrate stage PST) may be prohibited from the movement to the positions under the supply nozzle 13, the recovery nozzle 23, and the optical element 2 so that the liquid immersion area AR2 is not formed on the Z stage 52 (substrate stage PST) when the substrate P (or the dummy substrate DP) is not held on the substrate holder PSH.

The control unit CONT may change the movable area of the substrate stage PST depending on the detection result of the pressure detector 94. There is such a possibility that the liquid LQ, which remains on or adheres to the supply nozzle 13, the recovery nozzle 23, or the optical element 2 of the projection optical system PL, drips to cause the inflow into the substrate holder PSH and/or into the substrate stage PST, even when the liquid supply by the liquid supply mechanism 10 is stopped when the substrate P (or the dummy substrate DP) is not held on the substrate holder PSH as in the embodiment explained with reference to FIG. 13. The following inconvenience also arises in the situation as described above. That is, for example, any electric leakage is caused in the electric equipment in the substrate stage PST, any rust appears, and the liquid LQ flows into the vacuum system 93 via the suction hole 91. Further, the liquid LQ, which has dripped onto the holding surface of the substrate holder PSH, functions as a lubricating film, and the substrate P is held in a state of being deviated with respect to the desired position. Accordingly, the control unit CONT changes the movable area of the substrate stage PST depending on the detection result of the detector 94 which detects whether or not the substrate P is held on the substrate holder PSH.

Specifically, when the substrate P (or the dummy substrate DP) is not held on the substrate holder PSH, in other words, when the pressure detector 94 does not detect the substrate P, then the control unit CONT sets that the movable area of the substrate stage PST to be the area in which the substrate holder PSH is not positioned under the supply nozzles 13, the recovery nozzles 23, and the optical element 2. When the substrate P is not held on the substrate holder PSH, the control unit CONT moves the substrate stage PST so that the substrate holder PSH does not pass across the position under the supply nozzle 13 or the like, while monitoring the output of the laser interferometer 56. Accordingly, even when the liquid LQ drips from the supply nozzle 13 or the like, it is possible to avoid, for example, the inflow of the liquid LQ into the substrate holder PSH and into the substrate stage PST.

In the embodiment described above, the supply of the liquid LQ from the supply nozzles 13 is started when the liquid immersion area AR2 is formed on the substrate stage PST. However, the liquid immersion area AR2 can be also formed on the substrate stage PST such that the liquid, which is retained between the projection optical system PL and any predetermined object different from the substrate stage PST, is not recovered, and the liquid immersion area AR2, which is formed on the predetermined object, is moved onto the substrate stage PST.

In the embodiment described above, the reference mark PFM and the alignment marks 1 on the substrate P are detected not through the liquid, and the detection of the reference mark MFM is executed through the liquid. However, the invention, which relates to, for example, the provision of the liquid repellence of the surface of the reference member 3, the provision of the upper surface of the reference member 3 free from any difference in level, and the use of the dummy substrate DP, is also applicable when any arrangement, in which the reference mark PFM and the reference mark MFM can be simultaneously detected, is adopted. The invention is also applicable when the reference mark PFM and the alignment marks 1 on the substrate P are detected through the liquid. An exposure apparatus, which is constructed such that the reference mark PFM and the reference mark MFM can be simultaneously detected, is disclosed, for example, in Japanese Patent Application Laid-open No. 4-45512 (corresponding to U.S. Pat. No. 5,138,176), contents of which are incorporated herein by reference within a range of permission of the domestic laws and ordinances of the state designated or selected in this international application.

When the liquid immersion area and the non-liquid immersion area can be formed separately on the reference member 3, it is also allowable to adopt an arrangement in which the detection of the reference mark PFM without the liquid and the detection of the reference mark MFM with the liquid can be performed simultaneously, as disclosed in Japanese Patent Application Laid-open No. 4-45512. In this case, for example, Step SA3 and Step SA4 can be performed simultaneously in the alignment sequence shown in FIG. 6. Therefore, this arrangement is advantageous in view of the throughput. It goes without saying that an arrangement, in which the detection of the reference mark PFM and the detection of the reference mark MFM can be performed simultaneously, may be adopted as disclosed in Japanese Patent Application Laid-open No. 4-45512, when the substrate alignment system 5 is constructed such that the reference mark PFM and the alignment marks 1 on the substrate P are detected through the liquid.

In the embodiment described above, the two reference marks, i.e., the reference mark PFM and the reference mark MFM are provided on the reference member. However, Step SA3 and Step SA4 can be also performed by using a single reference mark (reference).

As described above, pure water is used as the liquid LQ in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also allowable that the exposure apparatus is provided with an ultra pure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (component in the polarization direction along with the longitudinal direction of the line pattern) is dominantly allowed to outgo from the pattern of the mask (reticle). When the space between the projection optical system PL and the resist coated on the surface of the substrate P is filled with the liquid, the diffracted light of the S-polarized light component, which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner, then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well.

In the embodiments of the present invention, the optical element 2 is attached to the end portion of the projection optical system PL. Accordingly, the lens makes it possible to adjust the optical characteristics of the projection optical system PL, for example, the aberration (for example, spherical aberration and comatic aberration). The optical element, which is attached to the end portion of the projection optical system PL, may be an optical plate which is usable to adjust the optical characteristics of the projection optical system PL. Alternatively, the optical element may be a plane parallel plate or parallel flat plate through which the exposure light beam EL is transmissive. When the optical element, which makes contact with the liquid LQ, is the plane parallel plate which is cheaper than the lens, it is enough that the plane parallel plate is merely exchanged immediately before supplying the liquid LQ even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid LQ is the lens. That is, the surface of the optical element to make contact with the liquid LQ is dirtied, for example, due to the adhesion of scattered particles generated from the resist by being irradiated with the exposure light beam EL or any impurity contained in the liquid LQ. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, instead of making the optical element to be exchangeable.

In the embodiments of the present invention, the space between the projection optical system PL and the surface of the substrate P is filled with the liquid LQ. However, for example, it is also allowable to adopt an arrangement in which the space is filled with the liquid LQ in such a state that a cover glass formed of a parallel flat plate is attached to the surface of the substrate P.

The exposure apparatus, to which the liquid immersion method is applied as described above, is constructed such that the wafer substrate P is exposed while filling the optical path space on the outgoing side of the terminal end optical element 2 of the projection optical system PL with the liquid (pure water). However, the optical path space, which is disposed on the incoming side of the terminal end optical element 2 of the projection optical system PL, may be also filled with the liquid (pure water) as disclosed in International Publication No. 2004/019128.

The liquid LQ is water in the embodiments of the present invention. However, the liquid LQ may be any liquid other than water. For example, when the light source of the exposure light beam EL is the $F_2$ laser, the $F_2$ laser beam is not transmitted through water. Therefore, liquids preferably usable as the liquid LQ may include, for example, fluorine-based liquid such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used.

The substrate P, which is usable in the respective embodiments described above, is not limited to the semiconductor wafer for producing the semiconductor device. The applicable substrates include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus provided with two stages which are movable independently in the XY directions while placing process objective substrates such as wafers separately thereon. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

In the case of the twin stage type exposure apparatus provided with the two stages, the exposure station for performing the exposure for the substrate and the alignment station for performing the positional adjustment for the shot area on the substrate are provided independently in some cases. In this arrangement, in order to improve the throughput, a substrate on the second stage is subjected to the alignment in the alignment station when the substrate on the first stage is subjected to the exposure in the exposure station. After the substrate on the second stage is subjected to the alignment, the second stage is moved to the exposure station, and the substrate, which has been subjected to the positional adjustment in the alignment station, is subjected to the exposure in the exposure station. During this process, the relative position with respect to the reference mark provided on the substrate stage as explained in the foregoing embodiment is determined for the substrate on the second stage in the alignment station. When the second stage is moved to the exposure station, the image formation position is determined on the basis of the reference mark in the exposure station as well. Therefore, the reference mark, which is of the type having been explained in the foregoing embodiment, is effectively utilized in the exposure and alignment stations of the exposure apparatus of the twin stage type.

In the embodiment described above, the exposure apparatus, in which the space between the projection optical system PL and the substrate P is locally filled with the liquid, is adopted. However, the present invention is also applicable to the liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, contents of which are incorporated herein by reference within a range of permission of the domestic laws and ordinances of the state designated or selected in this international application.

The present invention is also applicable to the exposure apparatus provided with the exposure stage which is movable while holding the process objective substrate such as the wafer and the measuring stage which includes measuring members such as measuring sensors and various types of reference members. In this case, at least parts of the reference member and the various types of measuring sensors arranged on the substrate stage PST in the embodiment described above can be arranged on the measuring stage. The exposure apparatus provided with the exposure stage and the measuring stage is described, for example, in Japanese Patent Application Laid-open No. 11-135400, contents of which are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 14:
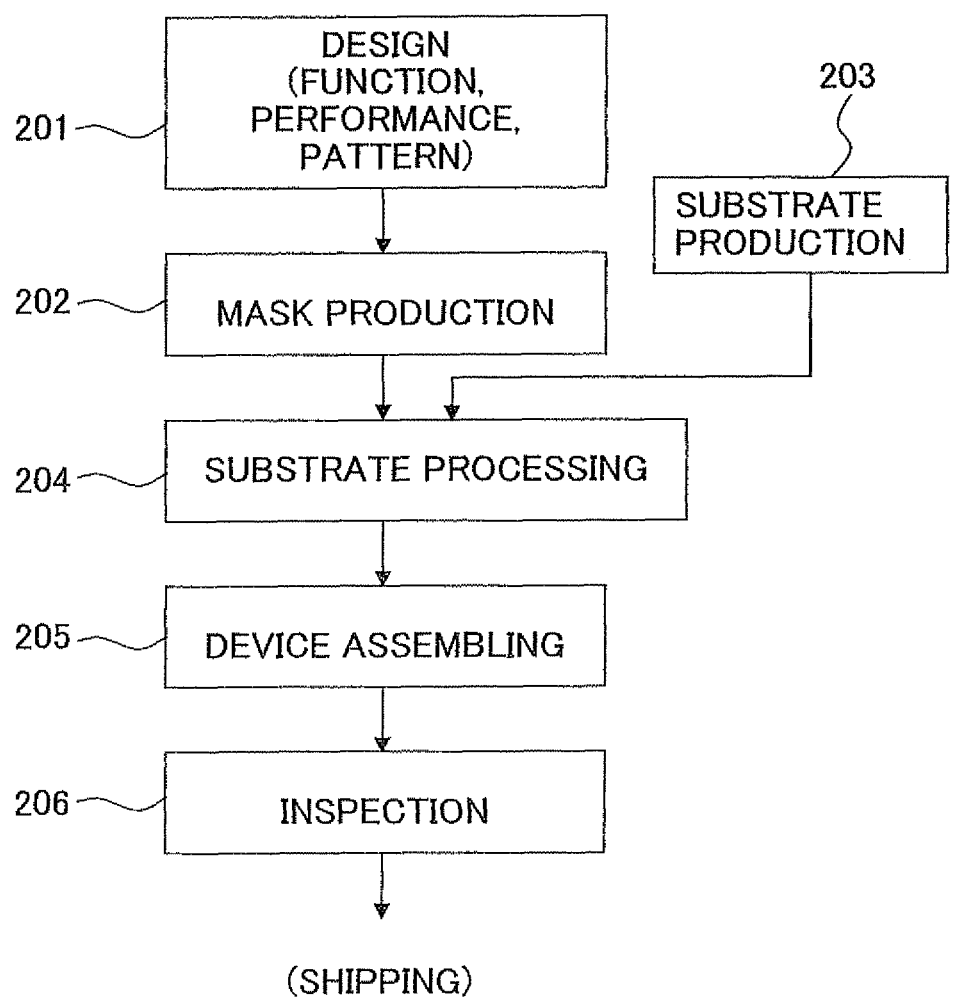
FIG. 14 shows a flow chart illustrating exemplary steps of producing a semiconductor device.

As shown in FIG. 14, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, the alignment process can be performed accurately. Therefore, it is possible to accurately form the desired pattern on the substrate. Further, it is possible to avoid any inflow of the liquid, for example, into the substrate stage.

What is claimed is:

1. A liquid immersion exposure apparatus comprising:
a projection system having a last optical element, the projection system projecting a beam onto a substrate through an immersion liquid;
a movable stage having a holder by which the substrate is held;
a measurement member provided on the movable stage, the measurement member having a measurement portion covered with a light-transmissive material;
a first alignment system by which an alignment mark is detected not through the immersion liquid; and
a second alignment system which is configured to receive a measurement light via the measurement member through the projection system and the immersion liquid between the projection system and the light-transmissive material of the measurement member in order to obtain first positional information of the beam to be projected by the projection system through the immersion liquid,
wherein in order to obtain the first positional information, the movable stage is moved so that the measurement member is under the projection system and a gap between the projection system and the measurement member is filled with the immersion liquid.

2. The apparatus of claim 1, wherein a coating of the light-transmissive material is applied over the measurement portion.

3. The apparatus of claim 1, wherein a plate of the light-transmissive material is provided over the measurement portion.

4. The apparatus of claim 3, wherein the light-transmissive plate includes a glass plate.

5. The apparatus of claim 1, wherein the light-transmissive material includes quartz.

6. The apparatus of claim 1, wherein the measurement member has a liquid-repellent upper surface.

7. The apparatus of claim 6, wherein the liquid-repellent upper surface is made by a liquid-repelling treatment.

8. The apparatus of claim 7, wherein the liquid-repelling treatment includes a coating of a liquid-repelling material.

9. The apparatus of claim 1, wherein the measurement portion includes a mark.

10. The apparatus of claim 1, wherein the measurement portion includes a light-transmitting portion.

11. The apparatus of claim 10, wherein the light-transmissive material is embedded in the light-transmitting portion.

12. The apparatus of claim 1, wherein the measurement portion is made by patterning a material having a light reflectance.

13. The apparatus of claim 12, wherein the material includes chromium.

14. The apparatus of claim 12, wherein the material includes chromium oxide.

15. The apparatus of claim 12, wherein second positional information of a plurality of shot areas of the substrate is detected by detecting the alignment mark by the first alignment system, the beam projected by the projection system through the immersion liquid and the substrate are aligned on the basis of the first and second positional informations.

16. A device manufacturing method comprising:
exposing a substrate using the liquid immersion exposure apparatus defined in claim 1, and
processing the exposed substrate.

17. A liquid immersion exposure apparatus comprising:
a projection system having a last optical element, the projection system projecting a beam onto a substrate through an immersion liquid;
a movable stage having a holder by which the substrate is held; and
a measurement member provided on the movable stage, the measurement member having a measurement portion covered with a light-transmissive material and the measurement member having a liquid-repellent upper surface which is made by a coating of a liquid-repellent material over the light-transmissive material;
wherein in order to use the measurement member, the movable stage is moved so that the measurement member is under the projection system and a gap between the projection system and the measurement member is filled with the immersion liquid.

18. The apparatus of claim 17, wherein a plate of the light-transmissive material is provided over the measurement portion.

19. The apparatus of claim 18, wherein the light-transmissive plate includes a glass plate.

20. The apparatus of claim 18, wherein the coating of the liquid-repellent material is applied on the plate.

21. The apparatus of claim 17, wherein the measurement portion includes a mark.

22. The apparatus of claim 17, wherein the measurement portion includes a light-transmitting portion.

23. The apparatus of claim 17, wherein the measurement portion is made by patterning a material having a light reflectance.

24. The apparatus of claim 23, wherein the material includes chromium.

25. The apparatus of claim 23, wherein the material includes chromium oxide.

26. A liquid immersion exposure method comprising:
holding a substrate on a holder of a movable stage on which a measurement member is provided, the measurement member having a measurement portion covered with a light-transmissive material;
detecting an alignment mark not through immersion liquid using a first alignment system;
obtaining first positional information of a beam to be projected by a projection system through immersion liquid using a second alignment system which is configured to receive a measurement light via the measurement member through the projection system and the immersion liquid between the projection system and the light-transmissive material of the measurement member; and projecting the beam onto the substrate through the projection system and the immersion liquid between the projection system and the substrate, wherein in order to obtain the first positional information, the movable stage is moved so that the measurement member is under the projection system and a gap between the projection system and the measurement member is filled with the immersion liquid.

27. The method of claim 26, wherein a coating of the light-transmissive material is applied over the measurement portion.

28. The method of claim 26, wherein a plate of the light-transmissive material is provided over the measurement portion.

29. The method of claim 28, wherein the light-transmissive plate includes a glass plate.

30. The method of claim 26, wherein the light-transmissive material includes quartz.

31. The method of claim 26, wherein the measurement member has a liquid-repellent upper surface.

32. The method of claim 31, wherein the liquid-repellent upper surface is made by a liquid-repelling treatment.

33. The method of claim 32, wherein the liquid-repelling treatment includes a coating of a liquid-repelling material.

34. The method of claim 26, wherein the measurement portion includes a mark.

35. The method of claim 26, wherein the measurement portion includes a light-transmitting portion.

36. The method of claim 35, wherein the light-transmissive material is embedded in the light-transmitting portion.

37. The method of claim 26, wherein the measurement portion is made by patterning a material having a light reflectance.

38. The method of claim 37, wherein the material includes chromium.

39. The method of claim 37, wherein the material includes chromium oxide.

40. The method of claim 37, wherein second positional information of a plurality of shot areas of the substrate is detected by detecting the alignment mark by the first alignment system, the beam projected by the projection system through the immersion liquid and the substrate are aligned on the basis of the first and second positional informations.

41. A device manufacturing method comprising:

exposing a substrate using the liquid immersion exposure method defined in claim 26, and processing the exposed substrate.

* * * * *